US012795882B2

(12) United States Patent
Lin et al.

(10) Patent No.: US 12,795,882 B2
(45) Date of Patent: Nov. 10, 2026

(54) INTEGRATED CIRCUIT DEVICE AND METHOD FOR FABRICATING THE SAME

(71) Applicants: TAIWAN SEMICONDUCTOR MANUFACTURING COMPANY, LTD., Hsinchu (TW); TSMC NANJING COMPANY LIMITED, Nanjing (CN)

(72) Inventors: Tzu-Chun Lin, New Taipei City (TW); Chien-Yu Huang, Taoyuan City (TW); Cheng Hung Lee, Hsinchu County (TW); Jun-Cheng Liu, Nanjing City (CN); Yen-Chi Chou, Tainan City (TW); Shao Hsuan Hsu, Taoyuan City (TW)

(73) Assignees: TAIWAN SEMICONDUCTOR MANUFACTURING COMPANY, LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 350 days.

(21) Appl. No.: 18/655,114

(22) Filed: May 3, 2024

(65) Prior Publication Data

US 2025/0331145 A1 Oct. 23, 2025

(30) Foreign Application Priority Data

Apr. 22, 2024 (CN) ......................... 202420843191.7

(51) Int. Cl.
*H10B 10/00* (2023.01)
*G11C 11/417* (2006.01)
(Continued)

(52) U.S. Cl.
CPC ............ *H10B 10/12* (2023.02); *G11C 11/417* (2013.01); *G11C 11/419* (2013.01); *H10D 1/60* (2025.01); *H10D 1/692* (2025.01)

(58) Field of Classification Search
CPC ..... G11C 11/41; G11C 11/413; G11C 11/416; G11C 11/417; G11C 11/419; H10B 10/00;
(Continued)

(56) References Cited

U.S. PATENT DOCUMENTS

2017/0154671 A1* 6/2017 Liaw ..................... G11C 11/412

FOREIGN PATENT DOCUMENTS

CN 106409330 B 6/2019

* cited by examiner

*Primary Examiner* — Cheung Lee
(74) *Attorney, Agent, or Firm* — Maschoff Brennan

(57) ABSTRACT

An integrated circuit device includes a plurality of static random access memory (SRAM) cells, a first bit line, a capacitor, a write driver transistor, and a negative voltage generator circuit. The first bit line is coupled with a column of the SRAM cells, wherein the first bit line extends substantially along a first direction. The capacitor includes a first electrode and a second electrode spaced apart from the first electrode. The first electrode has at least one first metal line extending substantially along the first direction, and a length of the at least one first metal line is less than a length of the first bit line in a top view. The write driver transistor is coupled between the first bit line and the first electrode of the capacitor. The negative voltage generator circuit is coupled to the second electrode of the capacitor.

20 Claims, 17 Drawing Sheets

(51) Int. Cl.
*G11C 11/419* (2006.01)
*H10D 1/60* (2025.01)
*H10D 1/68* (2025.01)

(58) Field of Classification Search
CPC ...... H10B 10/10; H10B 10/12; H10B 10/125; H10B 10/15; H10B 10/18; H10D 1/60; H10D 1/692; H10D 1/714; H10D 1/716
See application file for complete search history.

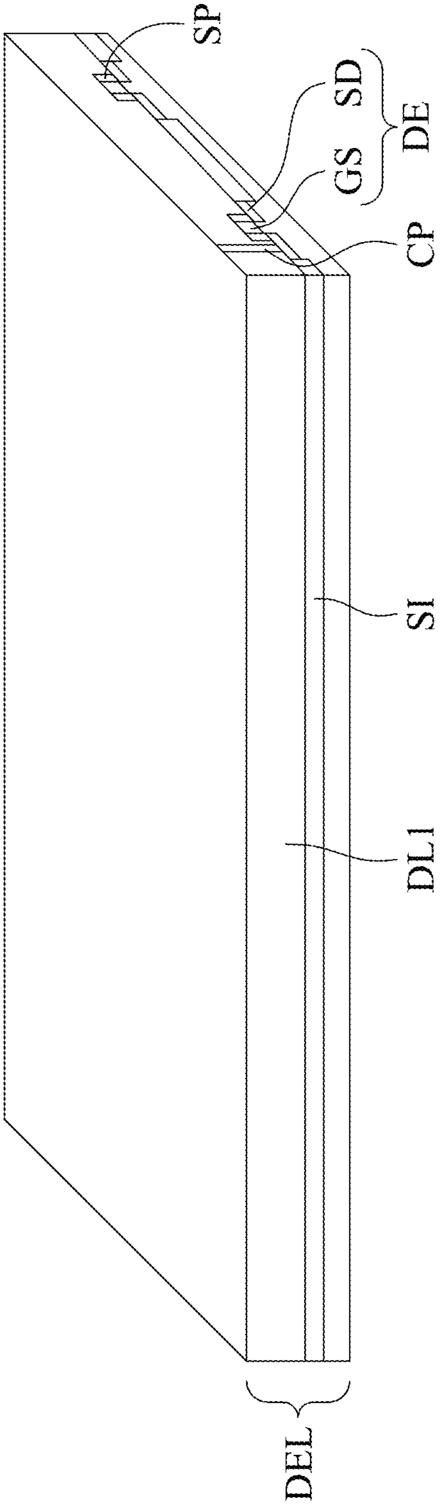
FIG. 6
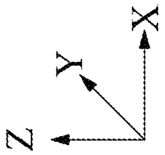

INTEGRATED CIRCUIT DEVICE AND METHOD FOR FABRICATING THE SAME

PRIORITY CLAIM AND CROSS-REFERENCE

This application claims priority to China Application Serial Number 202420843191.7, filed Apr. 22, 2024, which is herein incorporated by reference.

BACKGROUND

A type of integrated circuit memory is a static random access memory (SRAM) device. A SRAM memory device includes an array of bit cells, with each bit cell having six transistors connected between an upper reference potential and a lower reference potential. Each bit cell has two storage nodes where information may be stored. The first node stores the desired information, while the complementary information is stored at the second storage node. SRAM cells have the advantageous feature of holding data without requiring a refresh.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-9 illustrates a method of fabricating an integrated circuit device in accordance with some embodiments of the present disclosure.

DETAILED DESCRIPTION

Figure 1:
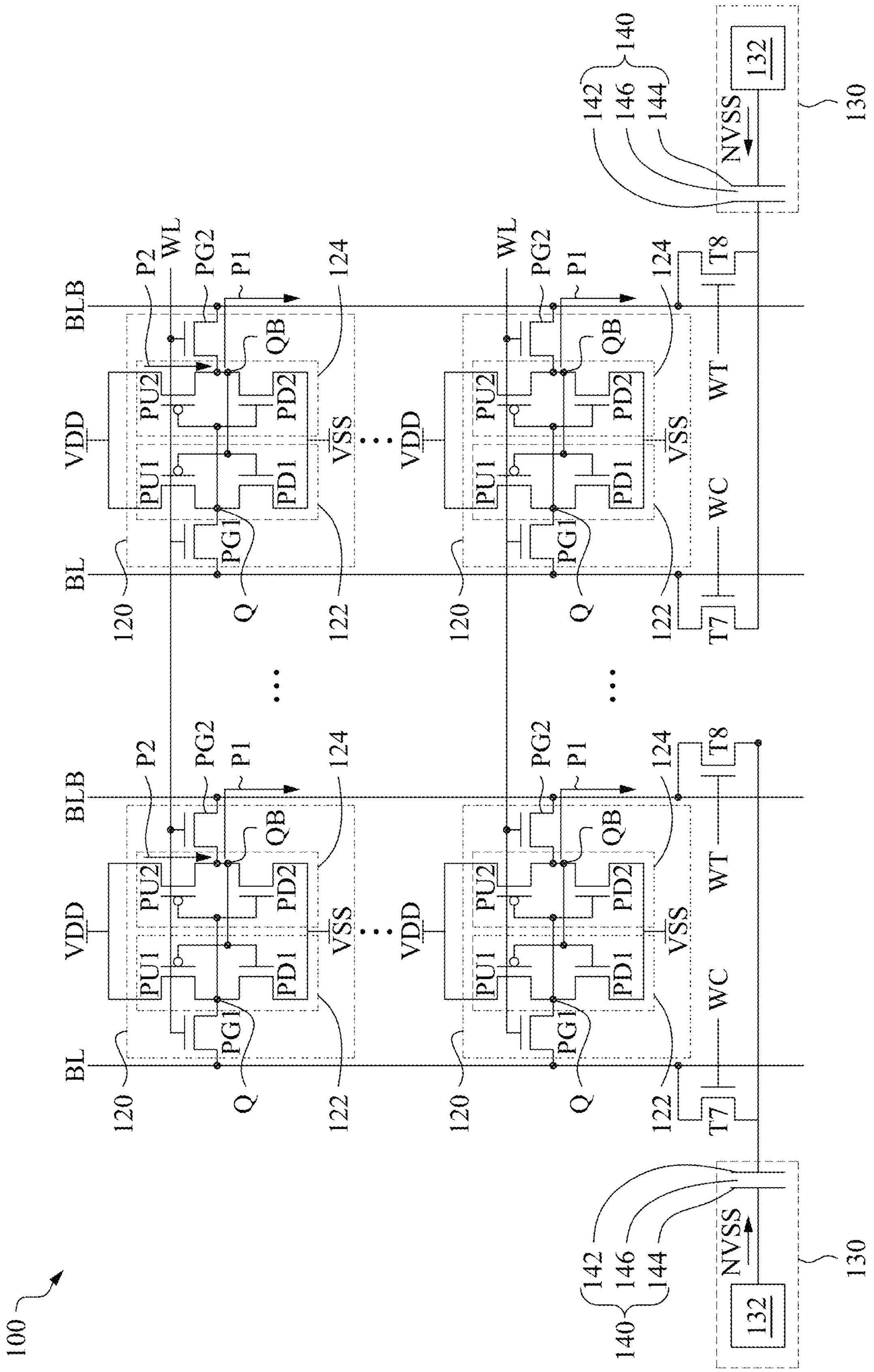
FIG. 1 is a schematic circuit diagram of an integrated circuit device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides processes to improve a memory device, for example, a Static Random Access Memory (SRAM), operation by providing a pull down circuit. The pull down circuit pulls down a voltage of a ground voltage node (also referred to as VSS node) of the memory device below a ground voltage through capacitive coupling.

FIG. 1 is a schematic circuit diagram of an integrated circuit device 100 in accordance with some embodiments of the present disclosure. For illustration, the integrated circuit device 100 includes an array of static random access memory (SRAM) cells 120 and pull down circuits 130. The pull down circuits 130 are respectively coupled to columns of the SRAM cells 120. In some embodiments, the SRAM cells 120 are arranged by columns and rows in a memory cell array (not shown in figures). For illustrative purposes, only two SRAM cells 120 coupled to bit lines BL and BLB to receive bit line signals are illustrated in FIG. 1. Various numbers of the SRAM cells 120 are within the contemplated scope of the present disclosure.

In some embodiments, the SRAM cell 120 includes pull-up transistors PU1 and PU2, which are p-type Metal-Oxide-Semiconductor (PMOS) transistors, and pull-down transistors PD1 and PD2 and pass-gate transistors PG1 and PG2, which are n-type Metal-Oxide-Semiconductor (NMOS) transistors. The gates of pass-gate transistors PG1 and PG2 are controlled by a word line WL that determines whether SRAM cell 120 is selected or not. A latch formed of pull-up transistors PU1 and PU2 and pull-down transistors PD1 and PD2 stores a bit, wherein the complementary values of the bit are stored in storage data node Q and storage data node QB. The stored bit can be written into, or read from, SRAM cell 120 through complementary bit lines including bit line BL and bit line BLB. SRAM cell 120 is powered through a positive power supply node VDD that has a positive power supply voltage. SRAM cell 120 is also connected to a power supply voltage node VSS, which may be an electrical ground. Transistors PU1 and PD1 form a first inverter 122. Transistors PU2 and PD2 form a second inverter 124. The first and second inverters 122 and 124 are cross-latched. For example, the input of the first inverter 122 (e.g., gates of the transistors PU1 and PD1) is connected to the output of the second inverter 124 (e.g., drains of the transistors PU2 and PD2), and the output of the first inverter 122 (e.g., drains of the transistors PU1 and PD1) is connected to the input of the second inverter 124 (e.g., gates of the transistors PU2 and PD2). The input of the first inverter 122 is also connected to the transistor PG2. The output of the first inverter 122 is also connected to the transistor PG1.

The sources of pull-up transistors PU1 and PU2 are connected to positive power supply node VDD. The sources of pull-down transistors PD1 and PD2 are connected to the power supply voltage node VSS. The gates of transistors PU1 and PD1 are connected to the drains of transistors PU2 and PD2, which form a connection node that is referred to as storage data node QB. The gates of transistors PU2 and PD2 are connected to the drains of transistors PU1 and PD1, which connection node is referred to as storage data node Q. A source/drain region of pass-gate transistor PG1 is connected to bit line BL. A source/drain region of pass-gate transistor PG2 is connected to bit line BLB. For illustration of operation, the data latch, including the inverter 122 and the inverter 124, is able to store a bit of data at the node Q. For illustration, a voltage level on the node Q is able to be configured at different voltage levels. The voltage level of the node Q represents logic "1" or logic "0" corresponding to logic data stored in the SRAM cell 120. The node QB has a logical level opposite to that of the node Q. For convenience of illustration hereinafter, logic "0" indicates a low level, and logic "1" indicates a high level. The indications are given for illustrative purposes.

The word line WL are utilized to select and trigger at least one of the SRAM cells 120 for a write/read operation of the integrated circuit device 100. When the SRAM cell 120 is not selected in response to the corresponding word line signal, the SRAM cell 120 maintains the same voltage levels on the node Q and the node QB.

In some embodiments, the pull down circuits 130 are configured to provide negative voltages to the bit lines BL and BLB for assisting the writing operation of the SRAM cells 120. For example, during the writing operation of the SRAM cells 120, the voltage stored in the node QB is pulled down through a current path P1, and the node QB is therefore written to be logic "0". For enhancing the writing capability of the SRAM cells 120, during the writing operation, the pull down circuits 130 are configured to provide the negative voltage to the bit line BLB so as to increase a voltage difference between the node QB and the bit line BLB, and the discharging capability through the current path P1 is therefore enhanced, such that the node QB is written to be logic "0" efficiently. As mentioned above, the writing capability of the SRAM cells 120 is improved because the discharging capability from the node QB to the bit line BLB enhances in response to the negative voltage being provided to the bit line BLB.

In some embodiments, the integrated circuit device 100 includes a write driver transistor T7 and a write driver transistor T8. The write driver transistor T7 is coupled between the pull down circuit 130 and the bit line BL, and the write driver transistor T8 is coupled between the pull down circuit 130 and the bit line BLB. For illustration of operation, the write driver transistor T7 is configured to transmit the negative voltage provided by the pull down circuit 130 to the bit line BL in response to a control signal WC. The write driver transistor T8 is configured to transmit the negative voltage provided by the pull down circuit 130 to the bit line BLB in response to a control signal WT.

In some embodiments, the pull down circuits 130 are also configured to pull down a high voltage of the node VDD provided to the inverter 122 and the inverter 124. For example, during the writing operation of the SRAM cell 120, the pull down circuits 130 are configured to pull down the high voltage of the node VDD provided to the inverter 122 and the inverter 124, and a charging capability through a current path P2 decreases. Since the charging capability through the current path P2 decreases, the SRAM cell 120 saves power during the writing operation so as to reduce the power consumption of the SRAM cell 120. In some embodiments, the pull down circuits 130 are configured to pull down the voltage stored in the node QB and the voltage provided to the inverter 122 and the inverter 124 independently. In some other embodiments, the pull down circuits 130 are configured to pull down the voltage stored in the node QB and the second voltage provided to the inverter 122 and the inverter 124 simultaneously.

Each of the pull down circuits 130 may include a pull down circuit capacitor 140. The pull down circuit capacitor 140 may have a first electrode 142, a second electrode 144, and a dielectric material 146 between the first and second electrodes 142 and 144. The first electrode 142 (also referred to as a first node of the pull down circuit capacitor 140) may be connected to the bit lines BL and BLB through the write driver transistors T7 and T8. The second electrode 144 may be coupled to a negative voltage level NVSS. In some embodiments, a negative voltage level NVSS is approximately equal to a voltage level of the node VDD. For example, the pull down circuits 130 may include a negative voltage generator circuit 132 providing the negative voltage level NVSS to the second electrode 144. The pull down circuits 130 may also be referred to as write assist circuits. The pull down circuit capacitors 140 that are coupled to different columns of the SRAM cells 120 (i.e., different bit lines BL/BLB) may be electrically isolated from each other.

Figure 2:
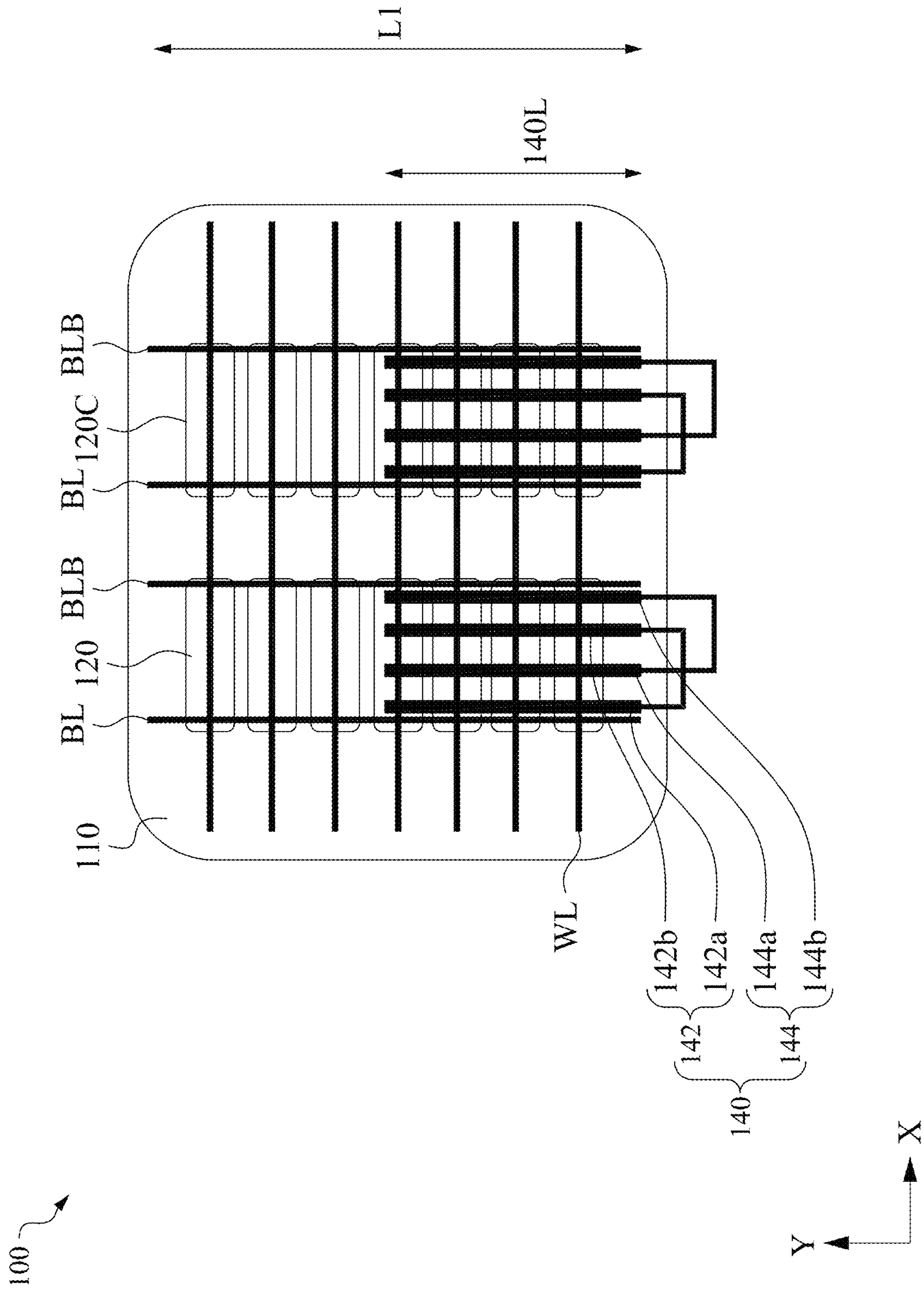
FIG. 2 is a schematic top view of an integrated circuit device in accordance with some embodiments of the present disclosure.

FIG. 2 is a schematic top view of an integrated circuit device 100 in accordance with some embodiments of the present disclosure. The SRAM cells 120 may be formed over a semiconductor substrate 110. For example, the six transistors of the SRAM cells 120 are planar transistors or non-planar transistors (e.g., fin field-effect-transistors (FinFET), or gate-all-around (GAA) transistors) formed over the semiconductor substrate 110. A FinFET has an elevated channel wrapped by a gate on more than one side (for example, the gate wraps a top and sidewalls of a "fin" of semiconductor material extending from a substrate). A GAA transistor (for example, a Nanosheet transistor or a Nanowire transistor) has a gate structure that can extend, partially or fully, around a channel region to provide access to the channel region on two or more sides. In FIG. 2, seven SRAM cells 120 are exemplarily illustrated in a column. Various numbers of the SRAM cells 120 are within the contemplated scope of the present disclosure. The integrated circuit device 100 includes bit lines BL and BLB and word lines WL, and each of the SRAM cells is coupled to one bit line BL, one bit line BLB, and one word line WL. The bit lines BL and BLB may extend along a direction Y, while the word lines WL may extend along a direction X crossing the direction Y. For example, the direction Y is orthogonal to the direction X.

In some embodiments, the pull down circuit capacitor 140 can be a coupling capacitor having multiple metal lines/wires or plates placed formed parallel to each other. For example, the first electrode 142 comprises two metal parallel lines (e.g., the metal lines 142*a* and 142*b*) electrically connected with each other, and the second electrode 144 comprises two metal parallel lines (e.g., the metal lines 144*a* and 144*b*) interlaced with the metal lines of the first electrode 142. It is noted that the number of the metal parallel lines can vary depending on device requirements, such as a size of the SRAM cell 120. For example, the number of the metal parallel lines of the first electrode 142 can be in a range from about 1 to about 10, and the number of the metal parallel lines of the second electrode 144 can be in a range from about 1 to about 10. The metal lines of the first and second electrodes 142 and 144 of the pull down circuit capacitor 140 may extend substantially along a direction (e.g., the direction Y) parallel with that of the bit lines BL and BLB. Through the configuration, the length of the metal lines of the first and second electrodes 142 and 144 can be adjusted according to the length of the bit lines BL and BLB, thereby mitigating the variation of the coupling NBL level with various bit line length.

In some embodiments of the present disclosure, a length 140L of the metal parallel lines of the first and second electrodes 142 and 144 (e.g., metal lines 142*a*, 142*b*, 144*a*, 144*b*) along the direction Y may be less than a length L1 of the bit lines BL and BLB along the direction Y. In some embodiments, a ratio of the length 140L to the length L1 may be in a range from about 0.1 to about 0.9. In some examples, the ratio of the length 140L to the length L1 may be in a range from about 0.1 to about 0.4, such as about 0.25. In some examples, the ratio of the length 140L to the length L1 may be in a range from about 0.4 to about 0.6, such as about 0.5. In some examples, the ratio of the length 140L to the length L1 may be in a range from about 0.6 to about 0.9, such as about 0.75. By reducing the length of the metal capacitance (e.g., first and second electrodes 142 and 144), the overlapping region between the bit line and the metal capacitance can be reduced, thereby solving resistance and capacitance (RC) problem, which in turn will improve/reduce the write power due to resistance and capacitance (RC) effect. In addition, by increasing the number of the lines of the metal capacitance (e.g., metal lines 142*a*, 142*b*, 144*a*, 144*b*), the capacitance coupling can be kept.

Figure 16:
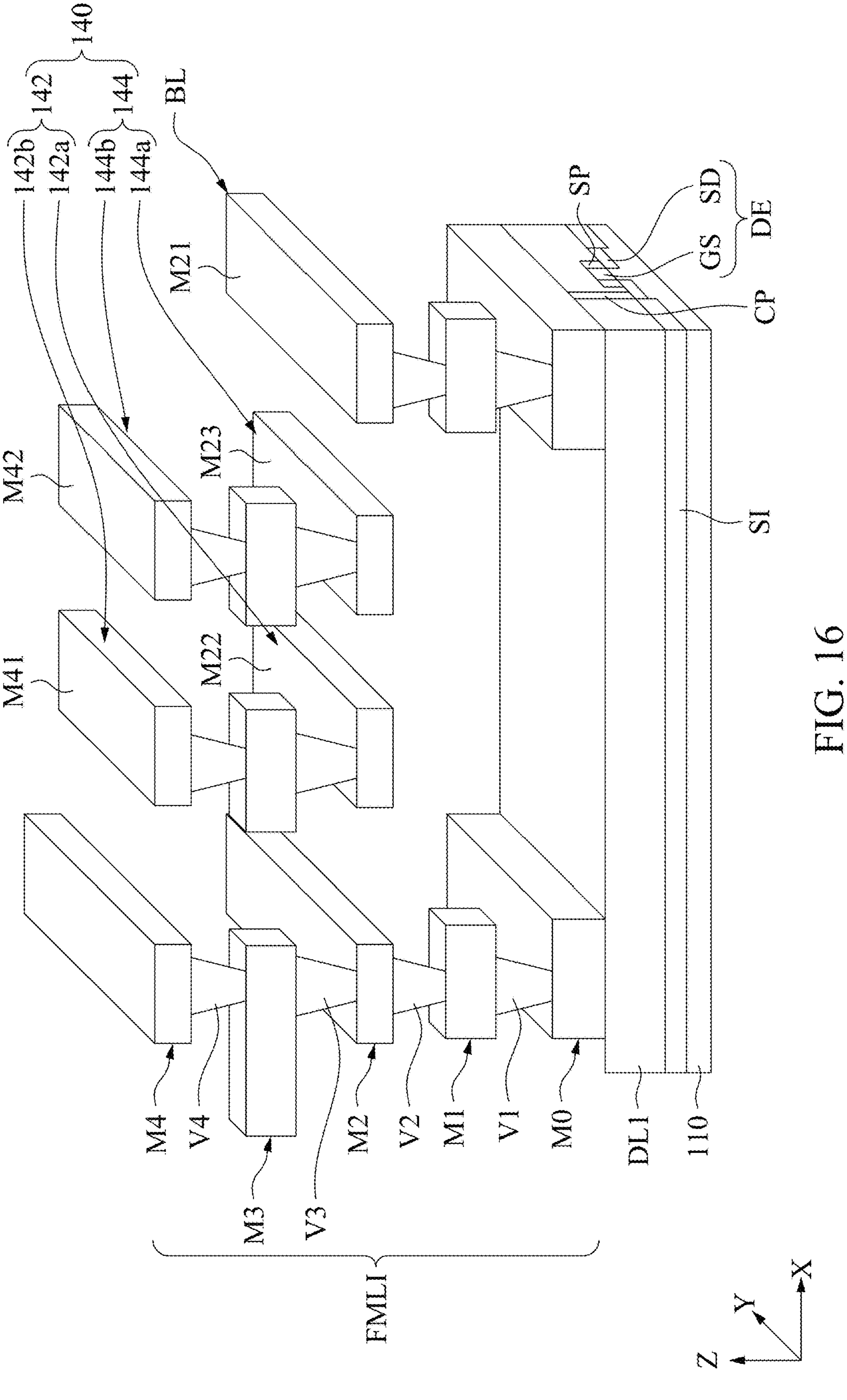
FIG. 16 is a schematic diagram of an integrated circuit device in accordance with some embodiments of the present disclosure.

In some embodiments of the present disclosure, by reducing a length of the metal lines of the electrodes 142/144, a number of the SRAM cell 120 overlapping one of the metal lines of the electrodes 142/144 (e.g., metal lines 142*a*, 142*b*, 144*a*, 144*b*) is less than a number of the SRAM cells overlapping one of the bit lines BL and BLB. For example, in FIG. 2, the metal lines of the electrodes 142/144 (e.g., metal lines 142*a*, 142*b*, 144*a*, 144*b*) overlaps four SRAM cells 120, while the bit lines BL and BLB overlaps seven SRAM cells 120. Stated differently, the bit lines BL and BLB overlaps all SRAM cells 120 in a same column, while the metal lines of the electrodes 142/144 (e.g., metal lines 142*a*, 142*b*, 144*a*, 144*b*) overlaps a portion of SRAM cells 120 in the same column, and leaves the other portions of SRAM cells 120 in the same column free from overlapping the metal lines of the electrodes 142/144 (e.g., metal lines 142*a*, 142*b*, 144*a*, 144*b*). In the context, in FIGS. 2-5, a cell boundary 120C of the SRAM cells 120 define a region where the six transistors are disposed as illustrated in FIG. 16 later.

The bit lines BL and BLB may extend across the SRAM array from a side of the SRAM array to another side of the SRAM array, while the metal lines of the electrodes 142/144 (e.g., metal lines 142*a*, 142*b*, 144*a*, 144*b*) may not extend across the SRAM array. For example, the bit line BL/BLB may have an end laterally aligned with ends of the metal lines of the electrodes 142/144 (e.g., metal lines 142*a*, 142*b*, 144*a*, 144*b*), other end misaligned with the other ends of the metal lines of the electrodes 142/144 (e.g., metal lines 142*a*, 142*b*, 144*a*, 144*b*). For example, the bit lines BL and BLB may extend beyond the other ends of the metal lines of the electrodes 142/144 (e.g., metal lines 142*a*, 142*b*, 144*a*, 144*b*). In some embodiments, the metal lines of the electrodes 142/144 (e.g., metal lines 142*a*, 142*b*, 144*a*, 144*b*) may terminate at a position directly over the SRAM cells 120. In some alternative embodiments, the metal lines of the electrodes 142/144 may terminate at a position over a space between the SRAM cells 120, not at a position directly over the SRAM cells 120.

In some embodiments, the length of the metal lines 142*a* and 142*b* of the first electrode 142 is substantially equal to the length of the metal lines 144*a* and 144*b* of the second electrode 144. The length of the metal lines 142*a* and 142*b* of the first electrode 142 may be substantially equal to each other, and the length of the metal lines 144*a* and 144*b* of the second electrode 144 may be substantially equal to each other. Through the configuration, effective capacitance coupling can be established between the first and second electrodes 142 and 144. In addition, in some embodiments of the present disclosure, a distance between the metal line 142*a*/142*b* and the metal line 144*a*/144*b* may be less than a distance between the bit lines BL and BLB, thereby kept the effective capacitance coupling.

In the illustrated embodiments, for a same column of SRAM cells 120 coupled with a same pull down circuit capacitor 140, the metal parallel lines of the first and second electrodes 142 and 144 (e.g., metal lines 142*a*, 142*b*, 144*a*, 144*b*) of the pull down circuit capacitor 140 are spaced apart from the bit lines BL and BLB in the top view. In some alternative embodiments, for a same column of SRAM cells 120 coupled with a same pull down circuit capacitor 140, one or more of the metal parallel lines of the first and second electrodes 142 and 144 (e.g., metal lines 142*a*, 142*b*, 144*a*, 144*b*) of the pull down circuit capacitor 140 may overlap the bit lines BL and BLB.

In the illustrated embodiments, for a same column of SRAM cells 120 coupled with a same pull down circuit capacitor 140, all metal parallel lines of the first and second electrodes 142 and 144 (e.g., metal lines 142*a*, 142*b*, 144*a*, 144*b*) of the pull down circuit capacitor 140 are located between bit lines BL and BLB in the top view. In some alternative embodiments, for a same column of SRAM cells 120 coupled with a same pull down circuit capacitor 140, a portion of the metal parallel lines of the first and second electrodes 142 and 144 of the pull down circuit capacitor 140 are located between bit lines BL and BLB, and the other portion of the metal parallel lines of the first and second electrodes 142 and 144 of the pull down circuit capacitor 140 are not located between bit lines BL and BLB in the top view. In some alternative embodiments, for a same column of SRAM cells 120 coupled with a same pull down circuit capacitor 140, none of the metal parallel lines of the first and second electrodes 142 and 144 of the pull down circuit capacitor 140 are located between bit lines BL and BLB in the top view.

Figure 3:
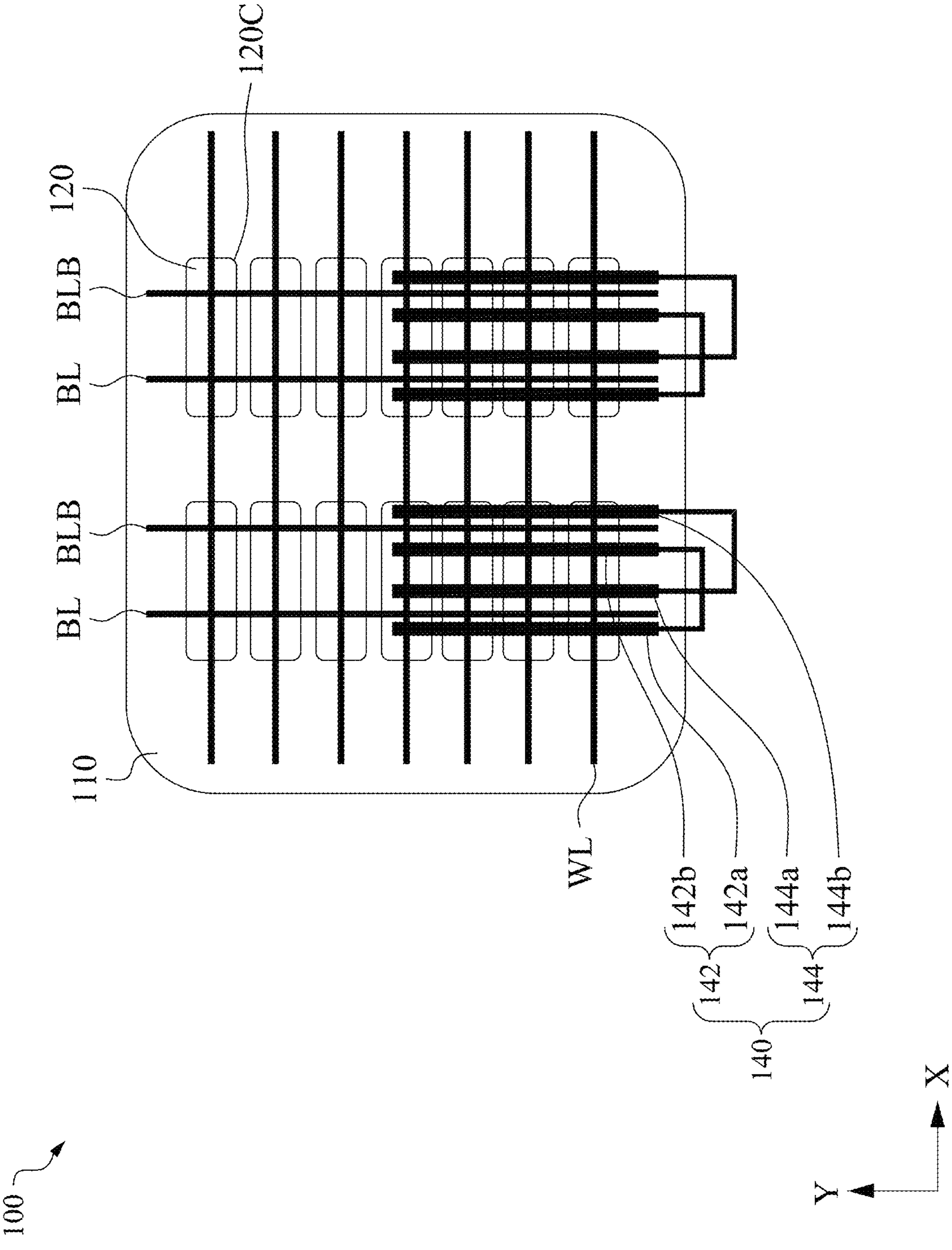
FIG. 3 is a schematic top view of an integrated circuit device in accordance with some embodiments of the present disclosure.

FIG. 3 is a schematic top view of an integrated circuit device in accordance with some embodiments of the present disclosure. Details of the present embodiments are similar to those illustrated in FIG. 2, except that: for a same column of SRAM cells 120 coupled with a same pull down circuit capacitor 140, two of the metal parallel lines of the first and second electrodes 142 and 144 of the pull down circuit capacitor 140 (e.g., the metal lines 144*a* and 142*b*) are located between bit lines BL and BLB, and the other two of the metal parallel lines of the first and second electrodes 142 and 144 of the pull down circuit capacitor 140 (e.g., the metal lines 142*a* and 144*b*) are not located between bit lines BL and BLB in the top view. Other details of the present disclosure are similar to those illustrated in previous embodiments, and thereto not repeated herein.

Figure 4:
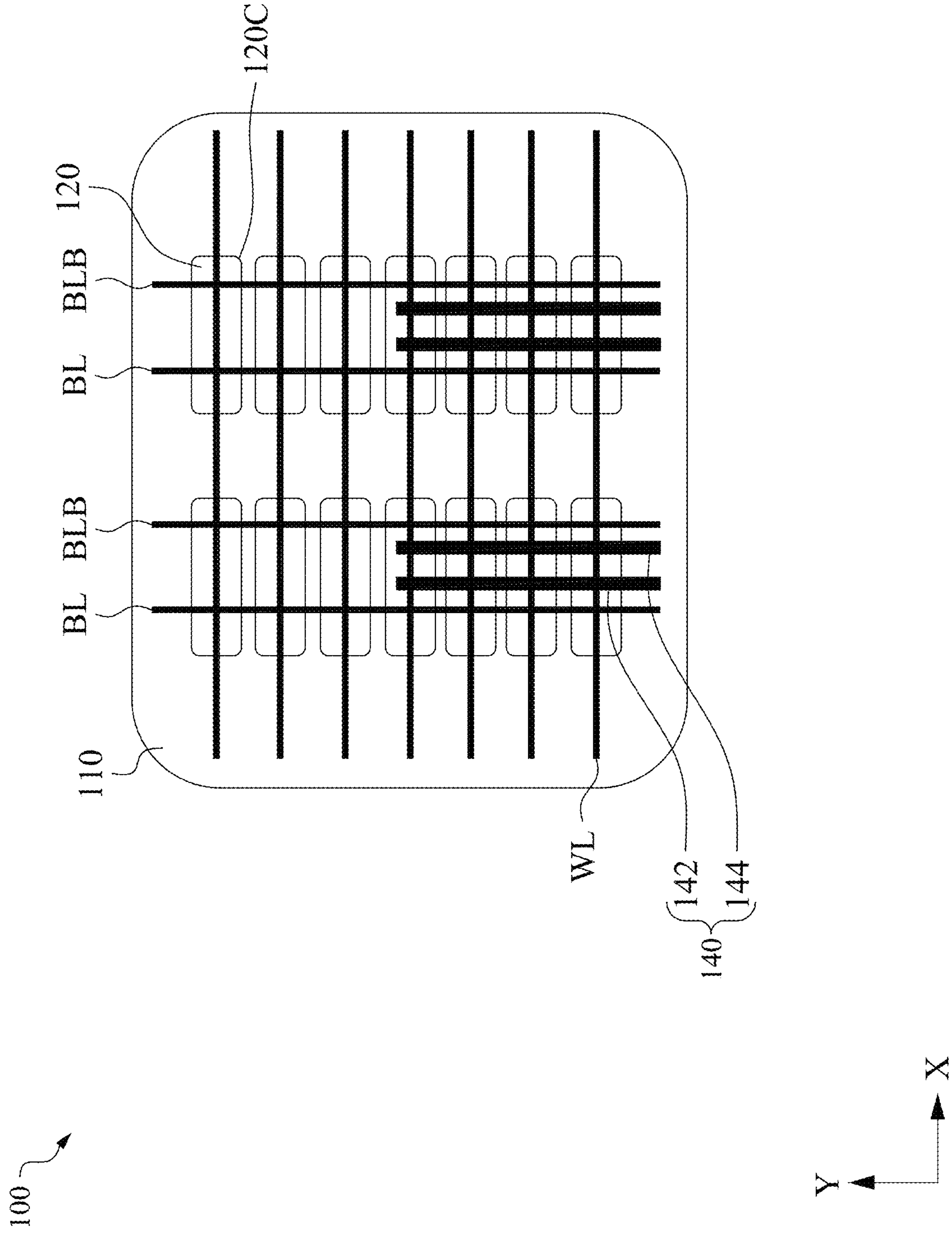
FIG. 4 is a schematic top view of an integrated circuit device in accordance with some embodiments of the present disclosure.

FIG. 4 is a schematic diagram of an integrated circuit device in accordance with some embodiments of the present disclosure. Details of the present embodiments are similar to those illustrated in FIG. 2, except that the number of the metal parallel line of the first and second electrodes 142 and 144 of a pull down circuit capacitor 140 is 1. In the present embodiments, for a same column of SRAM cells 120 coupled with a same pull down circuit capacitor 140, the metal parallel line of the first electrode 142 and the metal parallel line of the second electrode 144 of the pull down circuit capacitor 140 are located between bit lines BL and BLB in the top view. Other details of the present disclosure are similar to those illustrated in previous embodiments, and thereto not repeated herein.

Figure 5:
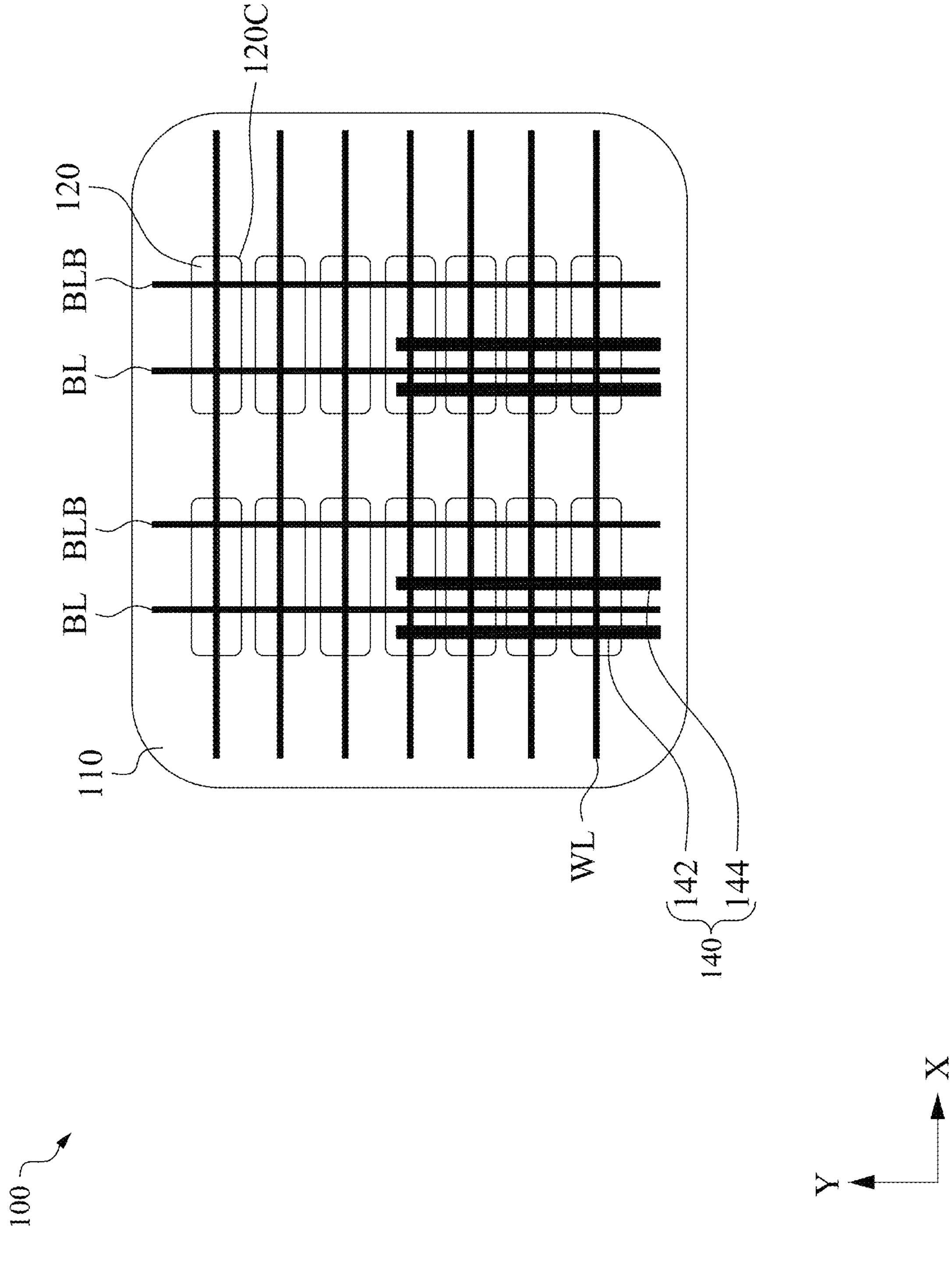
FIG. 5 is a schematic top view of an integrated circuit device in accordance with some embodiments of the present disclosure.

FIG. 5 is a schematic diagram of an integrated circuit device in accordance with some embodiments of the present disclosure. Details of the present embodiments are similar to those illustrated in FIG. 4, except that: for a same column of SRAM cells 120 coupled with a same pull down circuit capacitor 140, one of the metal parallel lines of the first and second electrodes 142 and 144 of the pull down circuit capacitor 140 (e.g., the metal line of the second electrode 144) are located between bit lines BL and BLB, and the other of the metal parallel lines of the first and second electrodes 142 and 144 of the pull down circuit capacitor 140 (e.g., the metal line of the first electrode 142) are not located between bit lines BL and BLB in the top view. Other details of the present disclosure are similar to those illustrated in previous embodiments, and thereto not repeated herein.

FIGS. 6-9 illustrates a method of fabricating an integrated circuit device in accordance with some embodiments of the present disclosure. It is understood that additional steps may be provided before, during, and after the steps shown in FIGS. 11-14, and some of the steps described below can be replaced or eliminated for additional embodiments of the method. The order of the operations/processes may be interchangeable.

Reference is made to FIG. 6. One or more active and/or passive devices DE are formed over the semiconductor substrate 110 through a front-end of line (FEOL) process. An interlayer dielectric (ILD) layer DL1 may be formed overlying the active and/or passive devices DE, and contact plugs CP are then formed in the ILD layer DL1 to connect the active and/or passive devices DE. The one or more active and/or passive devices DE are illustrated as a single FinFET transistor in FIG. 6. For example, the device DE may include a gate structure GS and source/drain regions SD over regions surrounded by shallow trench isolation (STI) regions SI. The gate structure GS may include a gate dielectric and a gate electrode over the gate dielectric. The spacers SP may be formed on opposite sides of the gate structure GS. In some embodiments, the source and drain regions SD may be doped regions formed in the substrate 110. In some alternative embodiments, the source and drain regions SD may be epitaxial structures formed over the substrate 110. In some embodiments, the one or more active and/or passive devices DE may include transistors (e.g., planar transistor or non-planar transistor, such as FinFET and GAA transistors), capacitors, resistors, diodes, photo-diodes, fuses, and the like. For example, the one or more active and/or passive devices DE may include various N-type metal-oxide semiconductor (NMOS) and/or P-type metal-oxide semiconductor (PMOS) device. And, the one or more active and/or passive devices DE may serve as the transistors of the SRAM cell 120 and the write driver transistors T7 and T8. It is appreciated that the above examples are provided for the purpose of illustration only and are not meant to limit the present disclosure in any manner. Other circuitry may be also formed as appropriate for a given application.

In some embodiments, the contact plugs CP are formed in the ILD layer DL1. The contact plugs CP electrically coupled to gates or source/drain regions of the devices DE. In the example illustrated in FIG. 11, the contact plugs CP make electrical connections to the source/drain regions SD of FinFET device DE.

Figure 7:
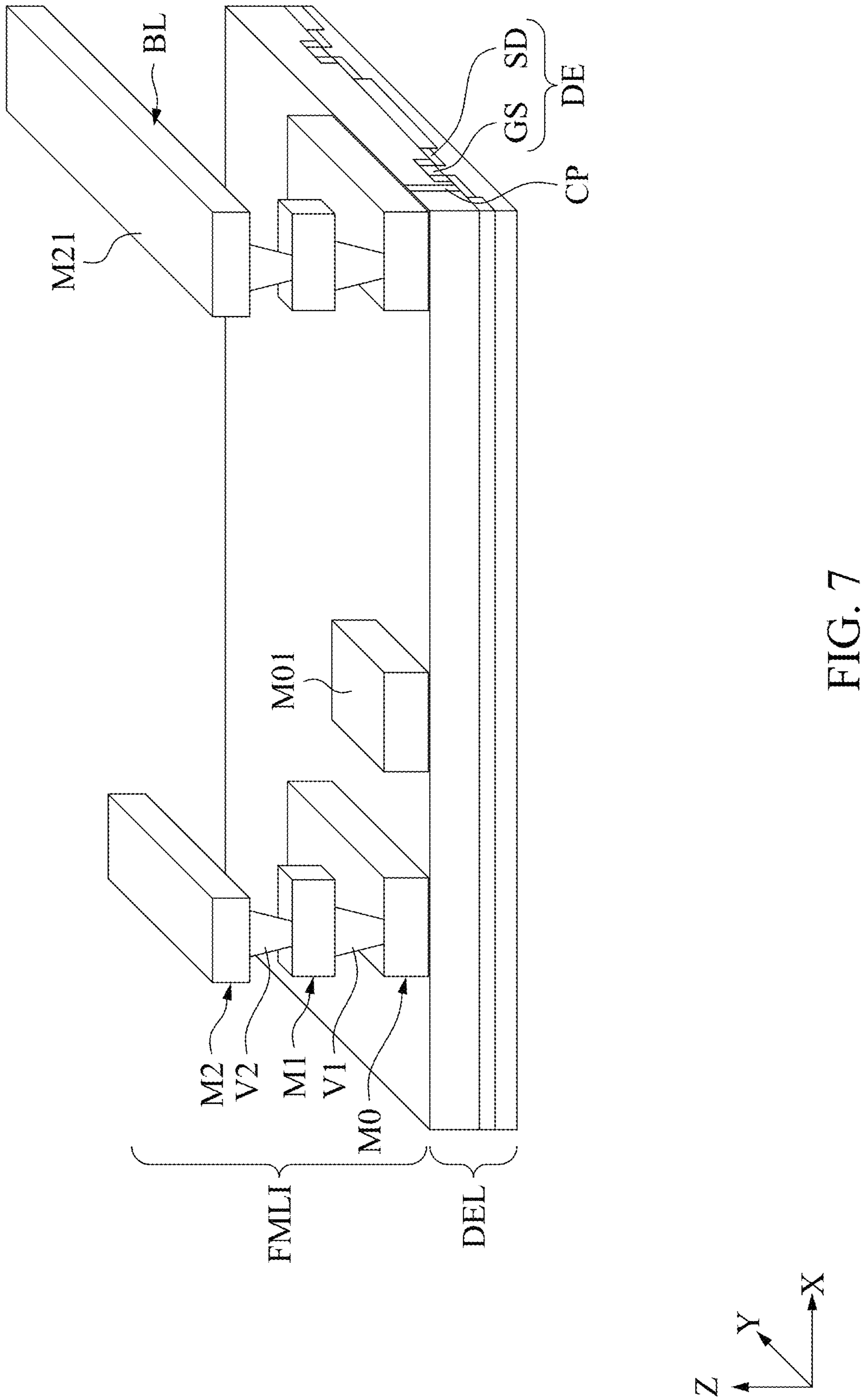

Reference is made to FIG. 7. After the formation of the contact plugs CP, an interconnect structure FMLI may be formed over the contact plugs CP through a back-end of line (BEOL) process. The interconnect structure FMLI can electrically interconnect the one or more active and/or passive devices DE to form functional electrical circuits. In the present embodiments, the interconnect structure FMLI may include one or more dielectric layers and a metallization pattern in the dielectric layers. In some embodiments, the dielectric layers of the interconnect structure FMLI may include undoped silicate glass (USG), low-k dielectric material, extreme low-k dielectric material, $SiO_2$, or other suitable materials. The dielectric layers of the interconnect structure FMLI may be referred to as inter-metal dielectric (IMD) or interlayer dielectric (ILD). The metallization pattern of the interconnect structure FMLI may include one or more horizontal interconnects, such as metallization layers M0-M2 including metal lines, respectively extending horizontally or laterally in the dielectric layers of the interconnect structure FMLI and vertical interconnects, such as conductive vias V1-V2, respectively extending vertically in the dielectric layers of the interconnect structure FMLI.

In the present embodiments, the metallization layers M0-M2 are stacked one over another and spaced apart from each other along a direction Z, which is substantially orthogonal to the directions X and Y. In some embodiments of the present disclosure, the metal lines of the metallization layers M0 and M2 extend along the direction Y, while the metal lines of the metallization layer M1 extend along the direction X. Each of the conductive vias V1-V2 may connect the metal lines of adjacent two of the metallization layers M0-M2 to each other. The metallization pattern (e.g., the metallization layers M0-M2 and conductive vias V1-V2) may be made of suitable conductive materials, such as Cu.

In some embodiments, the bit lines BL and/or bit lines BLB (referring to FIGS. 1-5) are metal lines of a same metallization layer, such as the metallization layer M2. For example, a metal line M21 of the metallization layer M2 may serve as bit lines BL and/or BLB. In some embodiments, the word lines WL (referring to FIGS. 1-5) are metal lines of the metallization layer M1.

Figure 8:
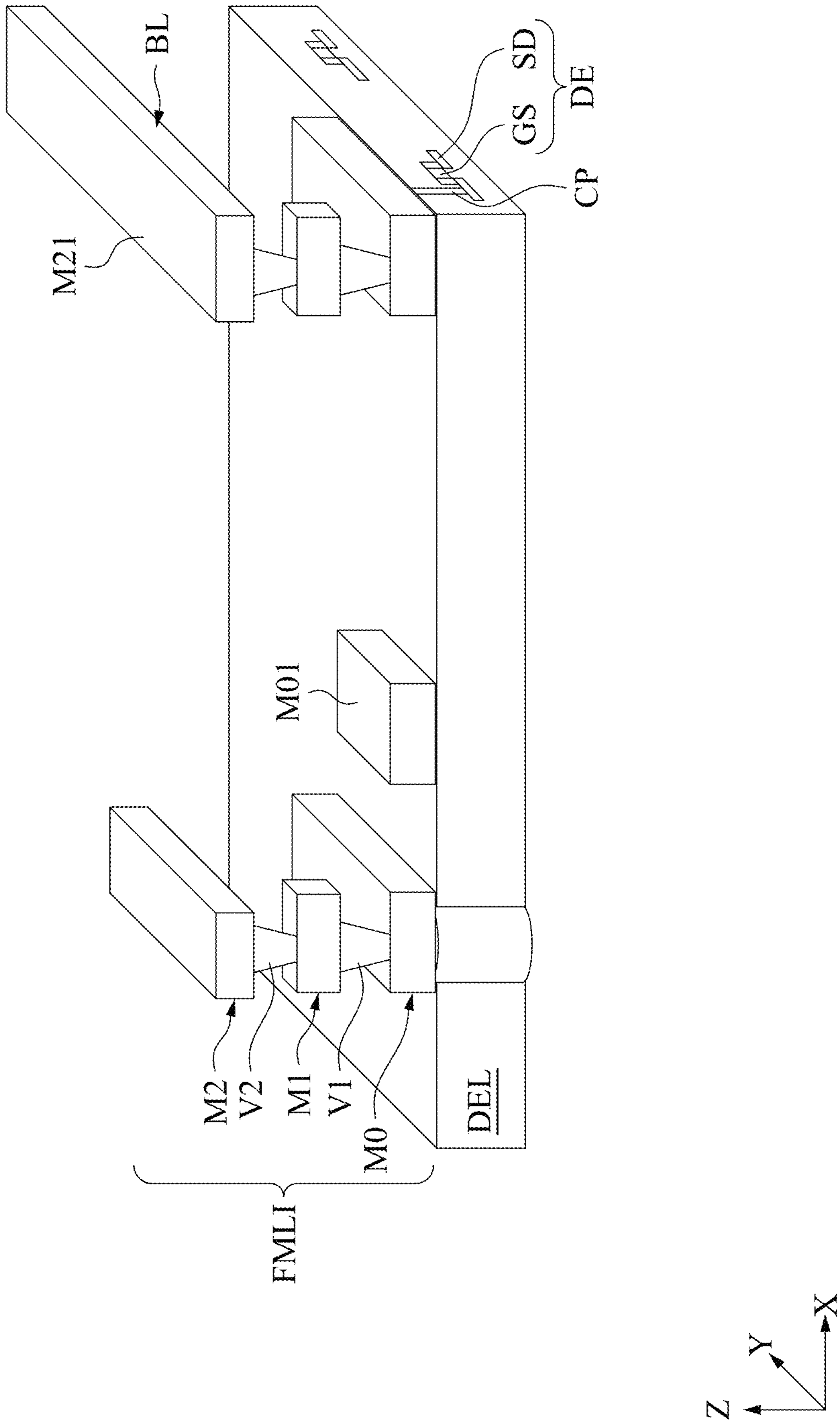

Reference is made to FIG. 8. A conductive through via TV can be formed through a device layer DEL, and in electrical connection with the interconnect structure FMLI. In the context, the device layer DEL may be referred to as a combination of the STI regions SI, the device DE, the contact plugs CP, and the ILD layer DL1 (referring to FIG. 7). The backside metallization process may optionally remove the semiconductor substrate 110 (referring to FIG. 7). As a result, the device layer DEL may optionally include a remaining portion of the semiconductor substrate 110 (referring to FIG. 7). In the present embodiments, the device DE may be a planar transistor or non-planar transistor, such as FinFET and GAA transistors.

Figure 9:
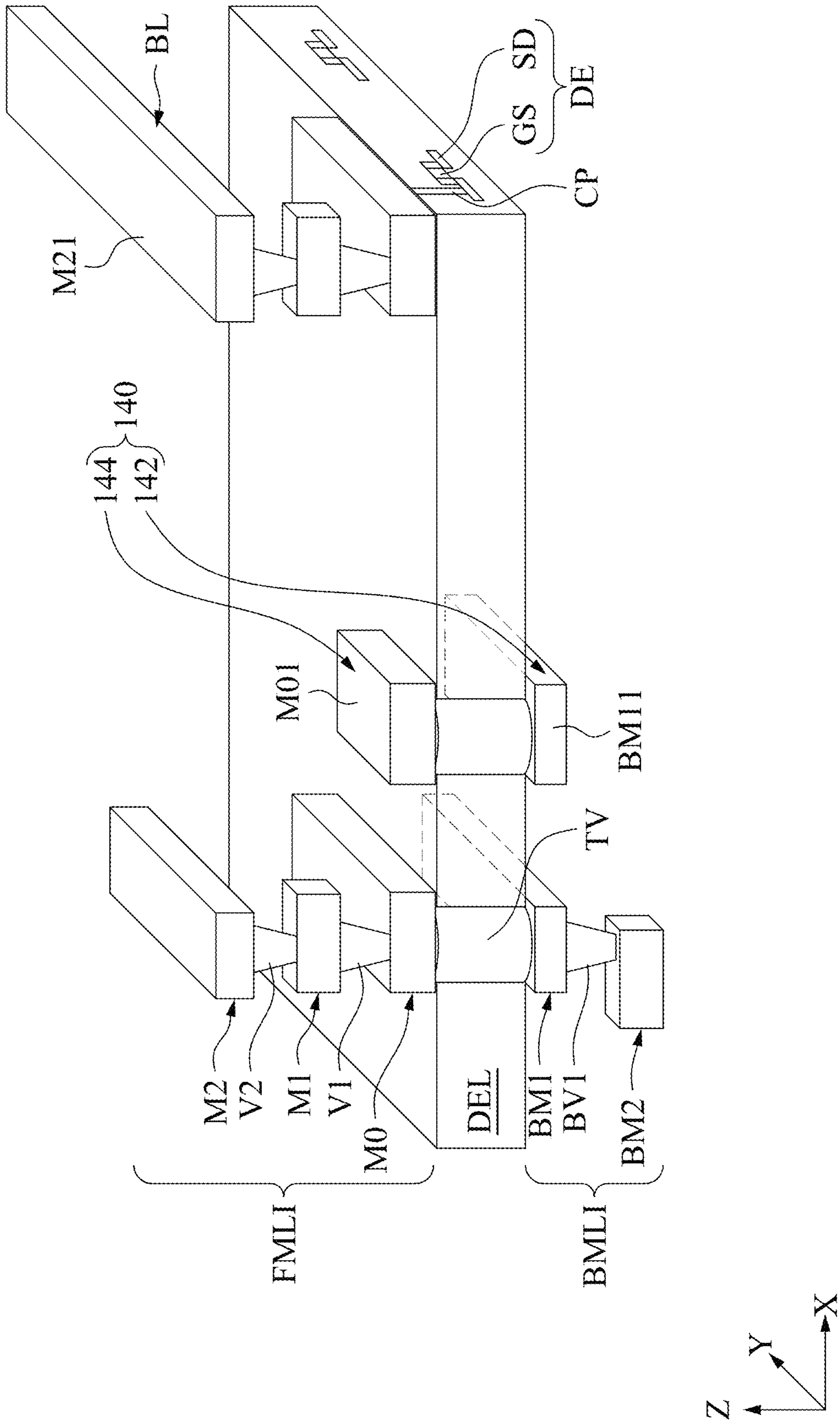

Reference is made to FIG. 9. A backside interconnect structure BMLI may be formed over a backside of the conductive through via TV through the backside metallization process. In the present embodiments, the backside interconnect structure BMLI may include one or more dielectric layers and a metallization pattern in the dielectric layers. In some embodiments, the dielectric layers of the backside interconnect structure BMLI may include undoped silicate glass (USG), low-k dielectric material, extreme low-k dielectric material, $SiO_2$, or other suitable materials. The dielectric layers of the backside interconnect structure BMLI may be referred to as inter-metal dielectric (IMD) or interlayer dielectric (ILD). The metallization pattern of the backside interconnect structure BMLI may include one or more horizontal interconnects, such as metallization layers BM1 and BM2 including metal lines, respectively extending horizontally or laterally in the dielectric layers of the interconnect structure FMLI and vertical interconnects, such as conductive vias BV1, respectively extending vertically in the dielectric layers of the interconnect structure FMLI. The metallization layers BM1 and BM2 are stacked one over another and spaced apart from each other along the direction Z. In some embodiments of the present disclosure, the metal lines of the metallization layer BM1 extend along the direction Y, while the metal lines of the metallization layer BM2 extend along the direction X. The conductive via BV1 may connect the metal lines of adjacent two of the metallization layers BM1 and BM2 to each other. The metallization pattern (e.g., the metallization layers BM1 and BM2 and conductive vias BV1) may be made of suitable conductive materials, such as Cu.

The metal lines of the first and second electrodes 142 and 144 of the pull down circuit capacitor 140 (referring to FIGS. 1-5) can track the bit lines BL and/or BLB. In the present embodiments, the first electrode 142 is of a different metallization layer than that of the second electrode 144. For example, the metal line BM11 of the metallization layer BM1 and the metal line M01 of the metallization layer M0 may respectively serve as the first electrode 142 (e.g., the metal lines 142*a* and 142*b* in FIGS. 2 and 3 or the single metal line of the first electrode 142 in FIGS. 4 and 5) and the second electrode 144 (e.g., the metal lines 144*a* and 144*b* in FIGS. 2 and 3 or the single metal line of the second electrode 144 in FIGS. 4 and 5). In some embodiments, the metal line BM11 of the metallization layer BM1 (e.g., the first electrode 142) may be electrically connected to the write driver transistor T7/T8 through the conductive through via TV and the metallization pattern of the interconnect structure FMLI or through a suitable backside conductive contact connecting the metallization layer BM1 to the device DE. In some embodiments, the metal line M01 of the metallization layer M0 (e.g., the second electrode 144) may be electrically connected to the write driver negative voltage generator circuit 132 as shown in FIG. 8. In the present embodiments, the electrodes 142 and 144 are illustrated as being of the metallization layer BM1 and M0, respectively. In some embodiments of the present disclosure, the electrodes 142 and 144 can be respectively of any two of the metallization layers BM2, BM1, and M0-M4 which has metal lines extending along a same direction as the bit lines BL/BLB. For example, the electrodes 142 and 144 can be respectively of any two of the metallization layers BM1, M0, M2, and M4, the metal lines of which may extend along a same direction as the bit lines BL/BLB at the metallization layers M2. Other details of the present embodiments are similar to those illustrated above, and not repeated herein.

Figure 10:
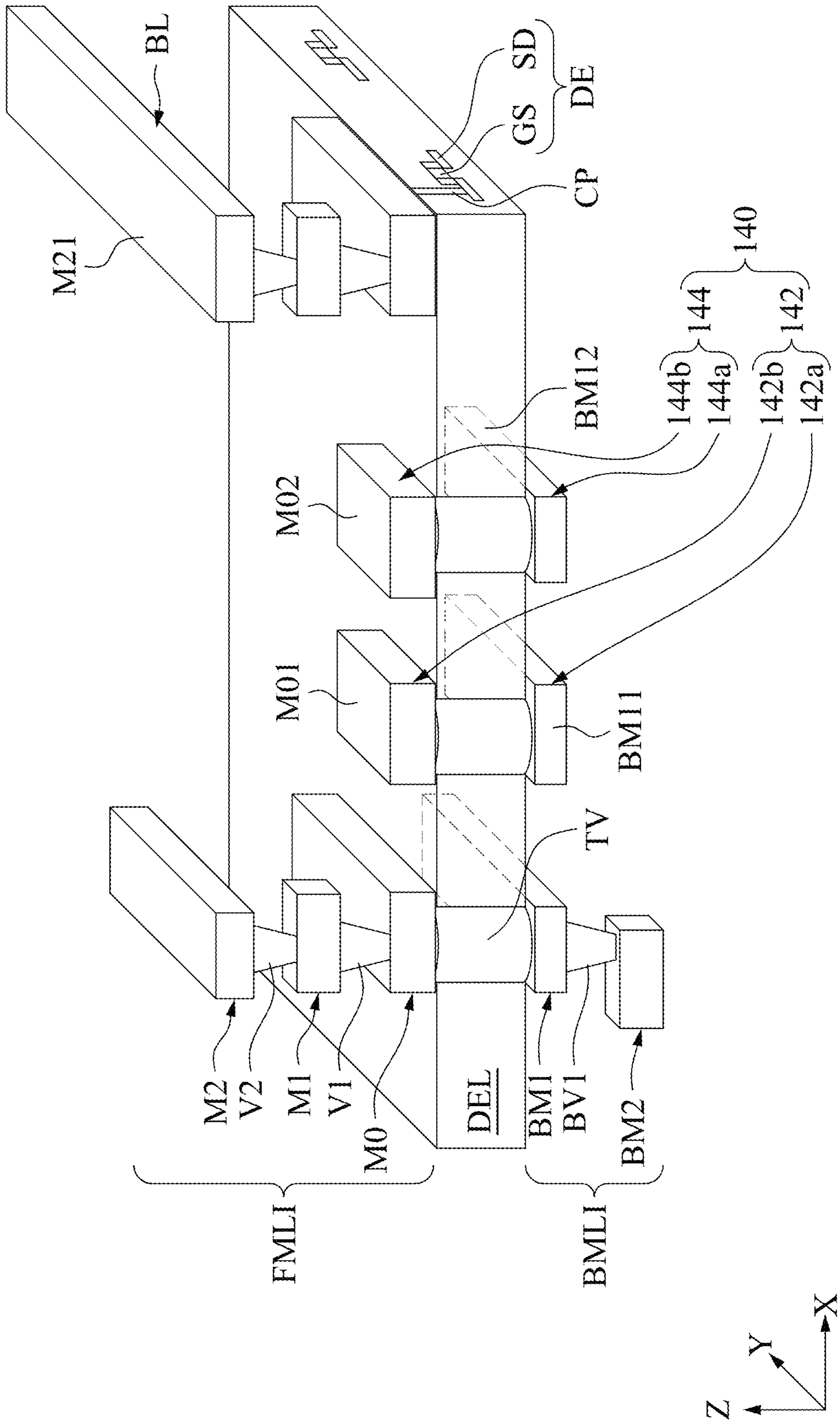
FIG. 10 is a schematic diagram of an integrated circuit device in accordance with some embodiments of the present disclosure.

FIG. 10 is a schematic diagram of an integrated circuit device in accordance with some embodiments of the present disclosure. Details of the present embodiments are similar to those illustrated in FIGS. 6-9, except that in the present embodiments, at least two of the metal lines of the first electrode 142 are of different metallization layers, and at least two of the metal lines of the second electrode 144 are of different metallization layers. For example, the metal line BM11 of the metallization layer BM1 and the metal line M01 of the metallization layer M0 may respectively serve as the metal lines 142*a* and 142*b* of the first electrode 142 (referring to FIGS. 2 and 3), in which the conductive through via TV establishes a conductive path from the metal line BM11 of the metallization layer BM1 to the metal line M01 of the metallization layer M0. For example, the metal line BM12 of the metallization layer BM1 and the metal line M02 of the metallization layer M0 may respectively serve as the metal lines 144*a* and 144*b* of the second electrode 144 (referring to FIGS. 2 and 3), in which the conductive through via TV establishes a conductive path from the metal line BM12 of the metallization layer BM1 to the metal line M02 of the metallization layer M0. In the present embodiments, at least two metal lines of the electrode 142/144 are illustrated as being of the metallization layer BM1 and M0, respectively. In some embodiments of the present disclosure, at least two metal lines of the electrode 142/144 can be respectively of any two of the metallization layers BM1, BM2, M0-M4 which has metal lines extending along a same direction as the bit lines BL/BLB. For example, at least two metal lines of the electrode 142/144 can be respectively of any two of the metallization layers BM1, M0, M2, and M4, the metal lines of which may extend along a same direction as the bit lines BL/BLB at the metallization layers M2. Other details of the present embodiments are similar to those illustrated above, and not repeated herein.

Figure 11:
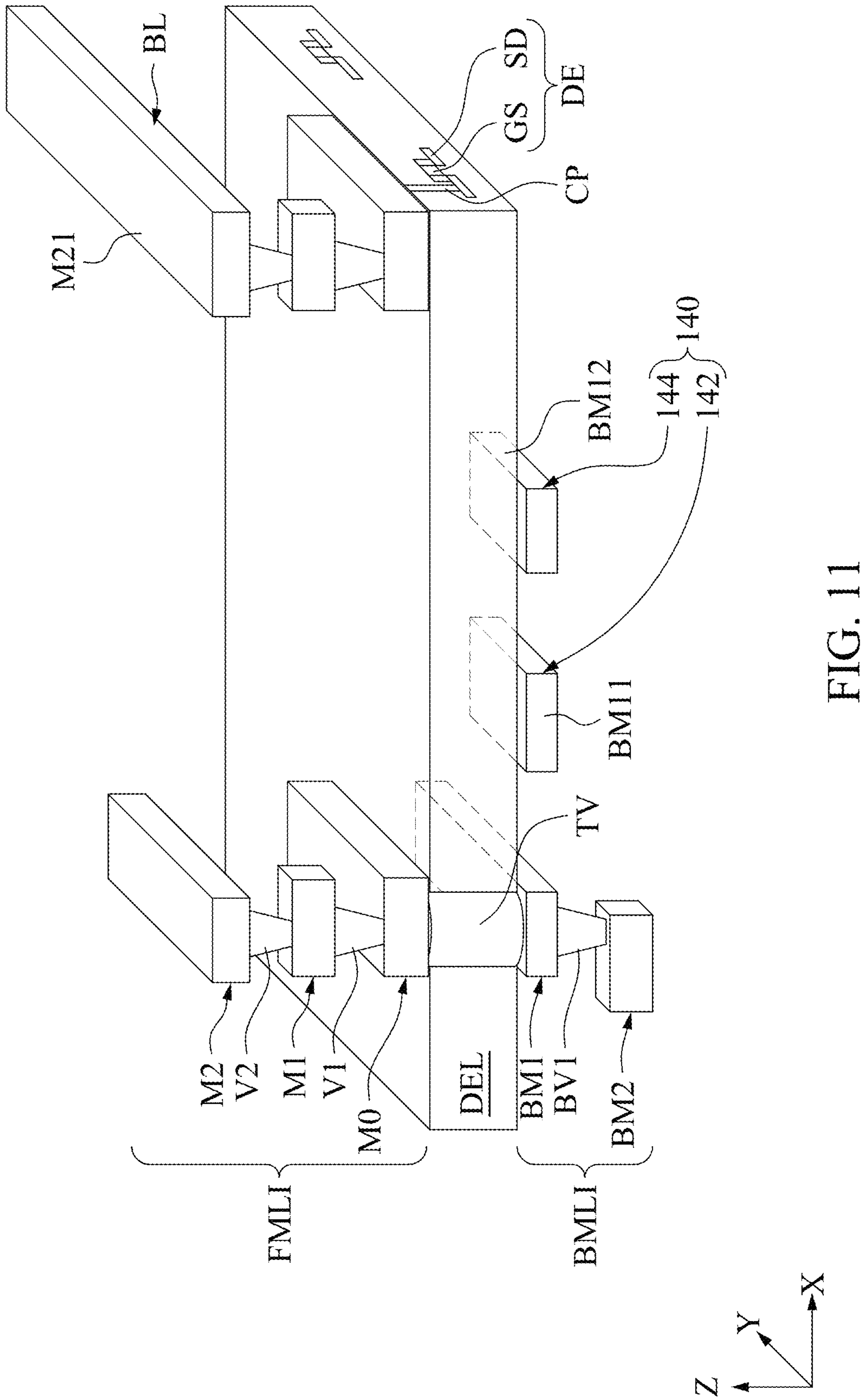
FIG. 11 is a schematic diagram of an integrated circuit device in accordance with some embodiments of the present disclosure.

FIG. 11 is a schematic diagram of an integrated circuit device in accordance with some embodiments of the present disclosure. Details of the present embodiments are similar to those illustrated in FIGS. 6-9, except that in the present embodiments, the metal lines of the first and second electrodes 142 and 144 of the pull down circuit capacitor 140 are of a same metallization layer. For example, the metal lines BM11 and BM12 of the metallization layer BM1 may serve as the metal lines of the first and second electrodes 142 and 144, respectively. In some embodiments, the metal lines BM11 of the metallization layer BM1 (e.g., the first electrode 142) may be electrically connected to the write driver transistor T7/T8 through the conductive through via TV and the metallization pattern of the interconnect structure FMLI or through a suitable backside conductive contact connecting the metallization layer BM1 to the device DE. And, the metal lines BM12 of the metallization layer BM1 (e.g., the first electrode 142) may be electrically connected to the negative voltage generator circuit 132 through the conductive through via TV and the metallization pattern of the interconnect structure FMLI or through a suitable backside conductive contact connecting the metallization layer BM1 to the device DE. Other details of the present embodiments are similar to those illustrated above, and not repeated herein.

Figure 12:
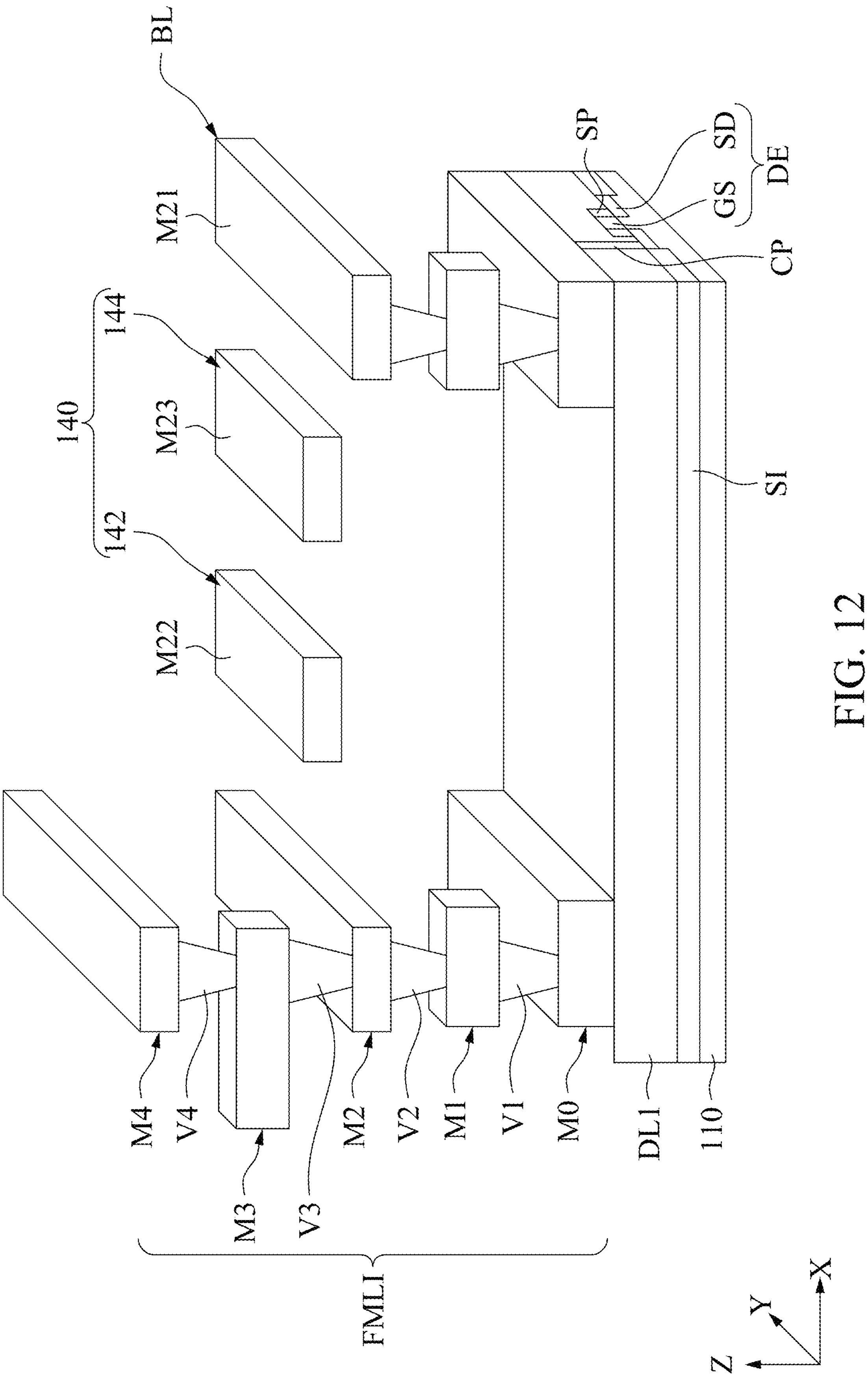
FIG. 12 is a schematic diagram of an integrated circuit device in accordance with some embodiments of the present disclosure.

FIG. 12 is a schematic diagram of an integrated circuit device in accordance with some embodiments of the present disclosure. Details of the present embodiments are similar to those illustrated in FIGS. 6-9, except that the metal lines of the first and second electrodes 142 and 144 of the pull down circuit capacitor 140 are of the interconnect structure FMLI, and the backside interconnect structure BMLI is omitted.

The metallization pattern of the interconnect structure FMLI may include one or more horizontal interconnects, such as metallization layers M0-M4 including metal lines, respectively extending horizontally or laterally in the dielectric layers of the interconnect structure FMLI and vertical interconnects, such as conductive vias V1-V4, respectively extending vertically in the dielectric layers of the interconnect structure FMLI. The metallization layers M0-M4 are stacked one over another and spaced apart from each other along the direction Z, which is substantially orthogonal to the directions X and Y. In some embodiments of the present disclosure, the metal lines of the metallization layers M0, M2, and M4 extend along the direction Y, while the metal lines of the metallization layer M1 and M3 extend along the direction X. Each of the conductive vias V1-V4 may connect the metal lines of adjacent two of the metallization layers M0-M4 to each other. The metallization pattern (e.g., the metallization layers M0-M4 and conductive vias V1-V4) may be made of suitable conductive materials, such as Cu.

In some embodiments of the present disclosure, the metal lines of the first and second electrodes 142 and 144 of the pull down circuit capacitor 140 and the bit lines BL and/or bit lines BLB are of a same metallization layer. For example, the metal lines M22 of the metallization layer M2 may serve as the metal line(s) of the first electrode 142 (e.g., the metal lines 142*a* and 142*b* in FIGS. 2 and 3 or the single metal line of the first electrode 142 in FIGS. 4 and 5), and the metal lines M23 of the metallization layer M2 may serve as the metal line(s) of the second electrode 144 (e.g., the metal lines 144*a* and 144*b* in FIGS. 2 and 3 or the single metal line of the second electrode 144 in FIGS. 4 and 5). Other details of the present embodiments are similar to those illustrated above, and not repeated herein.

Figure 13:
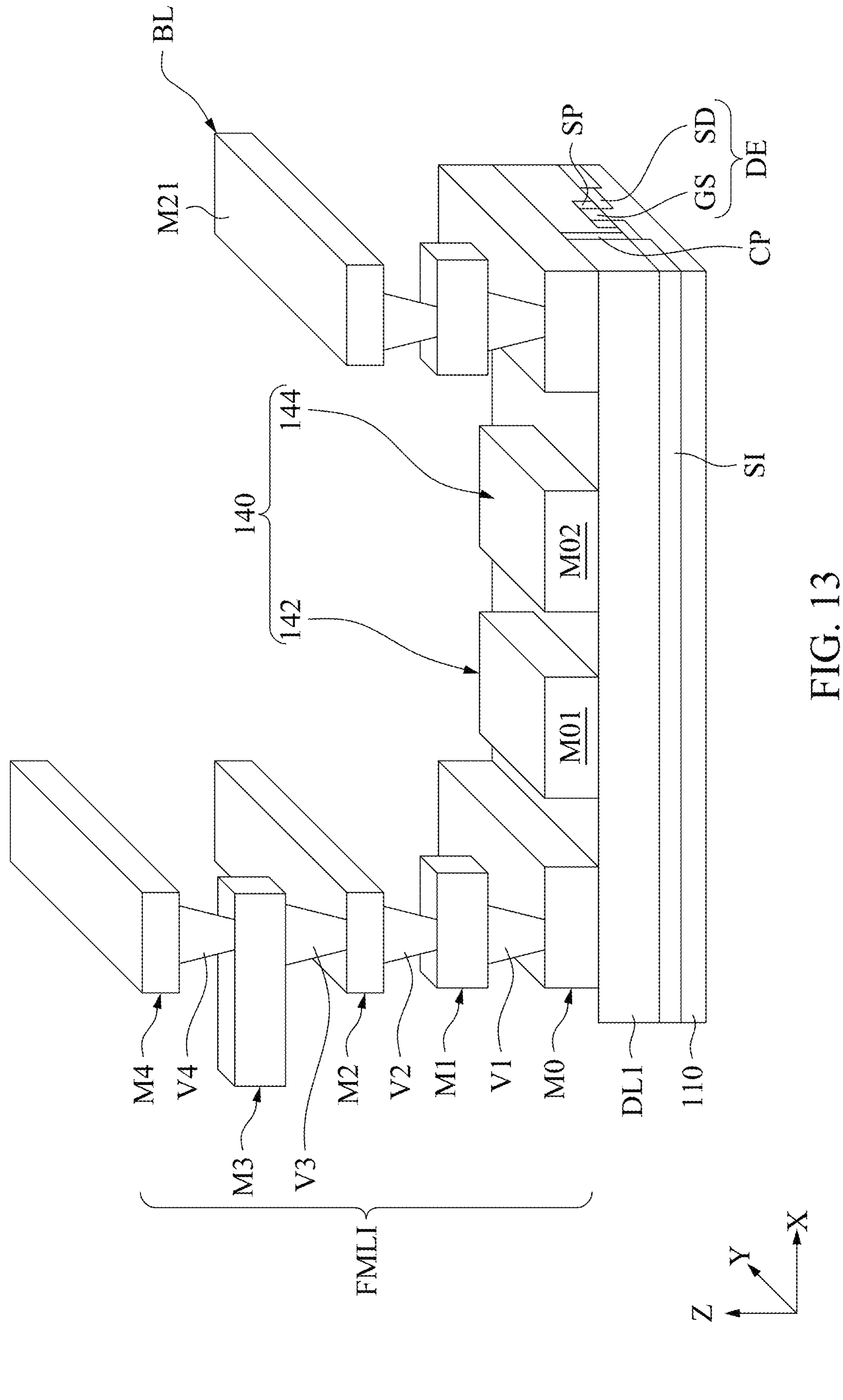
FIG. 13 is a schematic diagram of an integrated circuit device in accordance with some embodiments of the present disclosure.

FIG. 13 is a schematic diagram of an integrated circuit device in accordance with some embodiments of the present disclosure. Details of the present embodiments are similar to those illustrated in FIG. 12, except that the metal lines of the first and second electrodes 142 and 144 are of a same metallization layer different from a metallization layer of the bit lines BL and/or bit lines BLB (referring to FIGS. 1-5). For example, the metal line M21 of the metallization layer M2 may serve as bit lines BL and/or BLB (referring to FIGS. 1-5), and the metal lines of the metallization layer M0 or M4 may serve as the metal line(s) of the first electrode 142 and the metal line(s) of the second electrode 144. As shown in FIG. 13, the metal lines M01 of the metallization layer M0 may serve as the metal line(s) of the first electrode 142 (e.g., the metal lines 142*a* and 142*b* in FIGS. 2 and 3 or the single metal line of the first electrode 142 in FIGS. 4 and 5), and the metal lines M02 of the metallization layer M0 may serve as the metal line(s) of the second electrode 144 (e.g., the metal lines 144*a* and 144*b* in FIGS. 2 and 3 or the single metal line of the second electrode 144 in FIGS. 4 and 5).

In the present embodiments, the metal line(s) of the first electrode 142 and the metal line(s) of the second electrode 144 (e.g., the metal lines M01 and M02 of the metallization layer M0) may be spaced apart from the bit lines BL and/or bit lines BLB (e.g., the metal line M21 of the metallization layer M2) when viewed from top. Other details of the present embodiments are similar to those illustrated above, and not repeated herein.

Figure 14:
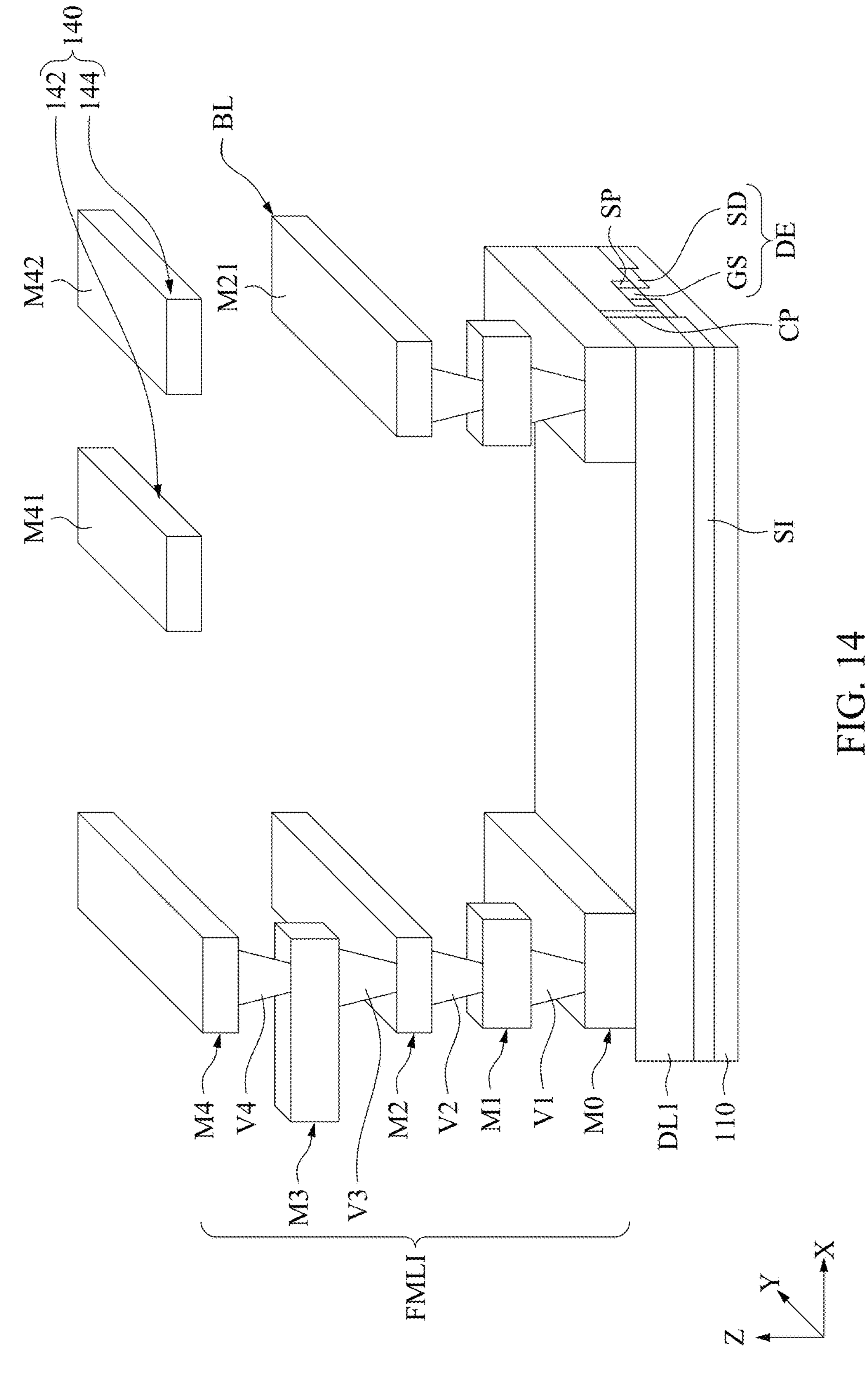
FIG. 14 is a schematic diagram of an integrated circuit device in accordance with some embodiments of the present disclosure.

FIG. 14 is a schematic diagram of an integrated circuit device in accordance with some embodiments of the present disclosure. Details of the present embodiments are similar to those illustrated in FIG. 12, except that at least one of the metal lines of the pull down circuit capacitor 140 may overlap the bit lines BL and/or bit lines BLB when viewed from top. In the present embodiments, the metal lines M41 of the metallization layer M4 may serve as the metal line(s) of the first electrode 142 (e.g., the metal lines 142*a* and 142*b* in FIGS. 2 and 3 or the single metal line of the first electrode 142 in FIGS. 4 and 5), and the metal lines M42 of the metallization layer M4 may serve as the metal line(s) of the second electrode 144 (e.g., the metal lines 144*a* and 144*b* in FIGS. 2 and 3 or the single metal line of the second electrode 144 in FIGS. 4 and 5). At least one of the metal line(s) of the first electrode 142 and the metal line(s) of the second electrode 144 (e.g., the metal lines M41 and M42 of the metallization layer M4) may overlap the bit lines BL and/or bit lines BLB (e.g., the metal line M21 of the metallization layer M2) when viewed from top. Other details of the present embodiments are similar to those illustrated above, and not repeated herein.

Figure 15:
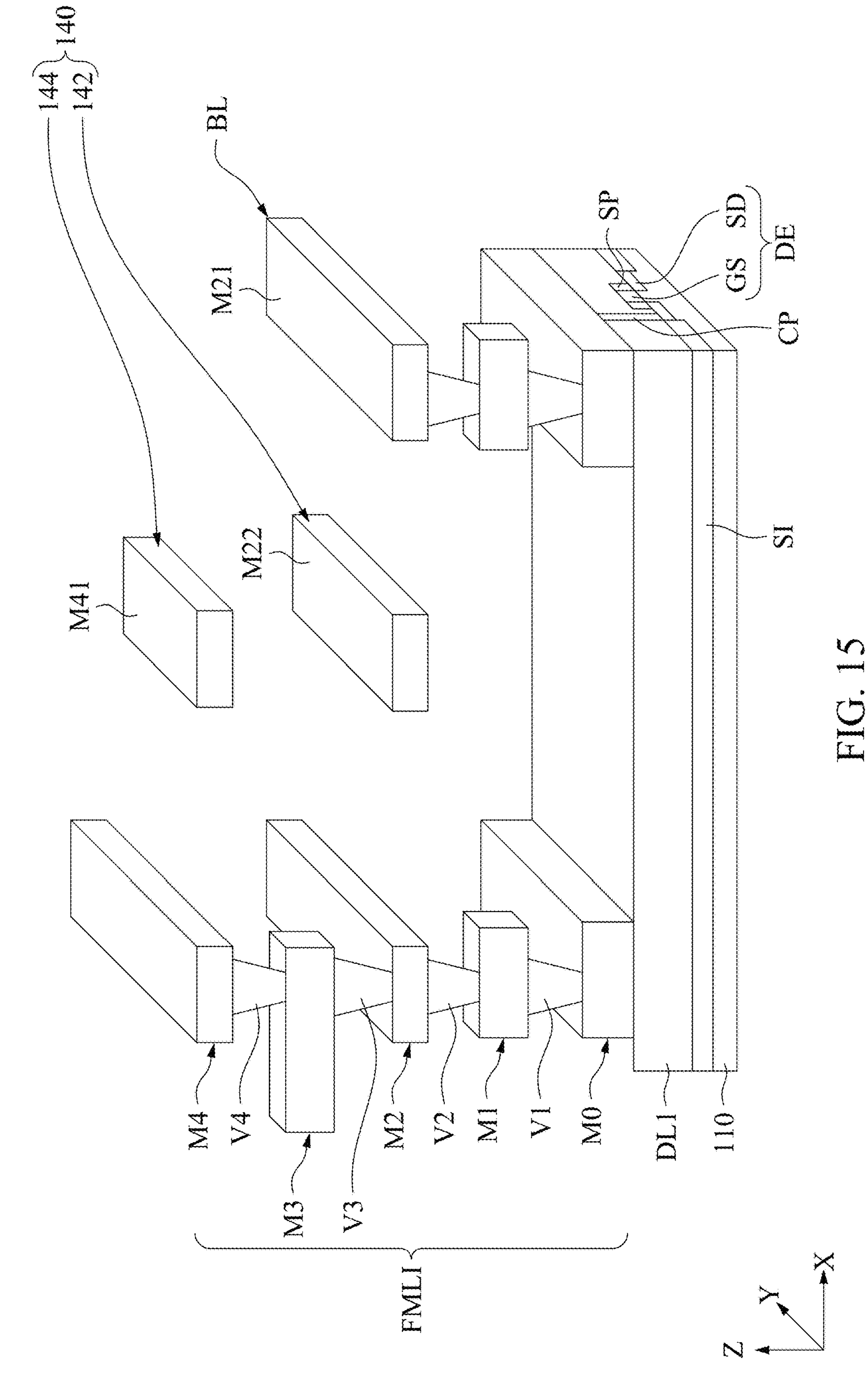
FIG. 15 is a schematic diagram of an integrated circuit device in accordance with some embodiments of the present disclosure.

FIG. 15 is a schematic diagram of an integrated circuit device in accordance with some embodiments of the present disclosure. Details of the present embodiments are similar to those illustrated in FIG. 12, except that the first electrode 142 is of a different metallization layer than that of the second electrode 144. For example, the metal line M22 of the metallization layer M2 and the metal line M41 of the metallization layer M4 may respectively serve as the first electrode 142 (e.g., the metal lines 142*a* and 142*b* in FIGS. 2 and 3 or the single metal line of the first electrode 142 in FIGS. 4 and 5) and the second electrode 144 (e.g., the metal lines 144*a* and 144*b* in FIGS. 2 and 3 or the single metal line of the second electrode 144 in FIGS. 4 and 5). In the present embodiments, the electrodes 142 and 144 are illustrated as being of the metallization layer M2 and M4, respectively. In some embodiments of the present disclosure, the electrodes 142 and 144 can be respectively of any two of the metallization layers M0-M4 which has metal lines extending along a same direction as the bit lines BL/BLB. For example, the electrodes 142 and 144 can be respectively of any two of the metallization layers M0, M2, and M4, the metal lines of which may extend along a same direction as the bit lines BL/BLB at the metallization layers M2. Other details of the present embodiments are similar to those illustrated above, and not repeated herein.

FIG. 16 is a schematic diagram of an integrated circuit device in accordance with some embodiments of the present disclosure. Details of the present embodiments are similar to those illustrated in FIG. 12, except that at least two of the metal lines of the first electrode 142 are of different metallization layers, and at least two of the metal lines of the second electrode 144 are of different metallization layers. For example, the metal line M22 of the metallization layer M2 and the metal line M41 of the metallization layer M4 may respectively serve as the metal lines 142*a* and 142*b* of the first electrode 142 (referring to FIGS. 2 and 3), in which the conductive vias V3, the metallization layer M3, and the conductive via V4 in combination establish a conductive path from the metal line M22 of the metallization layer M2 to the metal line M41 of the metallization layer M4. For example, the metal line M23 of the metallization layer M2 and the metal line M42 of the metallization layer M4 may respectively serve as the metal lines 144*a* and 144*b* of the second electrode 144 (referring to FIGS. 2 and 3), in which the conductive vias V3, the metallization layer M3, and the conductive via V4 in combination establish a conductive path from the metal line M23 of the metallization layer M2 to the metal line M42 of the metallization layer M4. In the present embodiments, at least two metal lines of the electrode 142/144 are illustrated as being of the metallization layer M2 and M4, respectively. In some embodiments of the present disclosure, at least two metal lines of the electrode 142/144 can be respectively of any two of the metallization layers M0-M4 which has metal lines extending along a same direction as the bit lines BL/BLB. For example, at least two metal lines of the electrode 142/144 can be respectively of any two of the metallization layers M0, M2, and M4, the metal lines of which may extend along a same direction as the bit lines BL/BLB at the metallization layers M2.

In some embodiments, the metal line 142*a* of the first electrode 142 (e.g., the metal line M22 of the metallization layer M2) may vertically overlap the metal line 142*b* of the first electrode 142 (e.g., the metal line M41 of the metallization layer M4). In some alternative embodiments, the metal line 142*a* of the first electrode 142 (e.g., the metal line M22 of the metallization layer M2) may not overlap the metal line 142*b* of the first electrode 142 (e.g., the metal line M41 of the metallization layer M4). Similarly, in some embodiments, the metal line 144*a* of the second electrode 144 (e.g., the metal line M23 of the metallization layer M2) may vertically overlap the metal line 144*b* of the second electrode 144 (e.g., the metal line M42 of the metallization layer M4). In some alternative embodiments, the metal line 144*a* of the second electrode 144 (e.g., the metal line M23 of the metallization layer M2) may not overlap the metal line 144*b* of the second electrode 144 (e.g., the metal line M42 of the metallization layer M4). Other details of the present embodiments are similar to those illustrated above, and not repeated herein.

Figure 17:
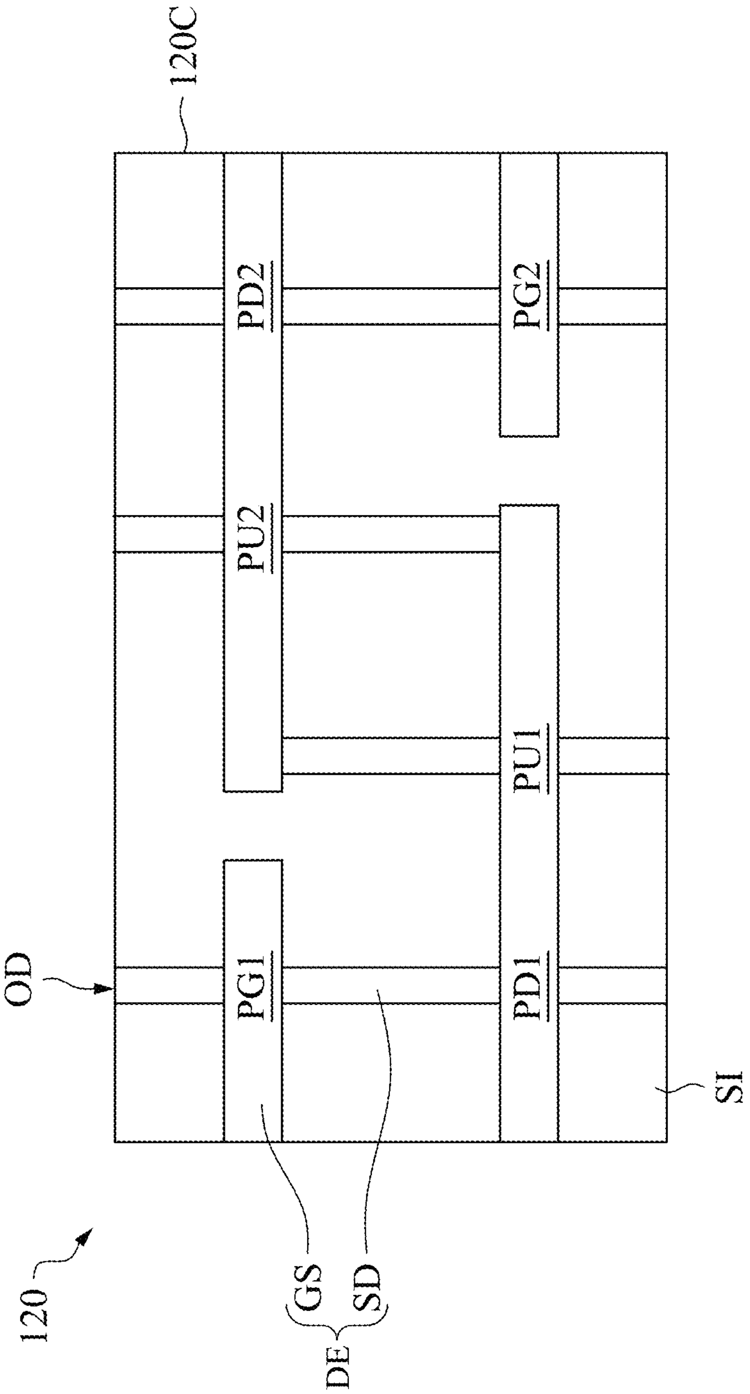
FIG. 17 is an exemplarily layout of a static random access memory (SRAM) cell in accordance with some embodiments of the present disclosure.

FIG. 17 is an exemplarily layout of a static random access memory (SRAM) cell in accordance with some embodiments of the present disclosure. The semiconductor substrate include active regions OD defined by the STI regions SI. The active regions OD may be semiconductor fins. Source/drain region SD are formed in or over the active regions OD. The gate structure GS and the source/drain region SD form the devices DE including the pull-up transistors PU1 and PU2, the pull-down transistors PD1 and PD2, and pass-gate transistors PG1 and PG2. One of ordinary skill in the art, however, should understand that features of the various embodiments described herein may be used for forming other types of devices, such as an 8T-SRAM memory device or other integrated circuits. The cell layouts may be flipped or rotated to enable higher packing densities.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a capacitor of a pull down circuit coupled to a bit line is designed with a reduced metal-capacitance length, thereby improving write power. Another advantage is that the metal-capacitance also can track with bit line length. Still another advantage is that the reduction in metal-capacitance length can solve RC effect, while maintaining capacitance coupling.

According to some embodiments of the present disclosure, an integrated circuit device includes a plurality of static random access memory (SRAM) cells, a first bit line, a capacitor, a write driver transistor, and a negative voltage generator circuit. The first bit line is coupled with a column of the SRAM cells, wherein the first bit line extends substantially along a first direction. The capacitor includes a first electrode and a second electrode spaced apart from the first electrode. The first electrode has at least one first metal line extending substantially along the first direction, and a length of the at least one first metal line is less than a length of the first bit line in a top view. The write driver transistor is coupled between the first bit line and the first electrode of the capacitor. The negative voltage generator circuit is coupled to the second electrode of the capacitor.

According to some embodiments of the present disclosure, an integrated circuit device includes first, second, and third static random access memory (SRAM) cells arranged in a sequence substantially along a first direction in a top view; a first bit line coupled with the first to third SRAM cells, wherein the first bit line extends substantially along the first direction and overlaps the first to third SRAM cells in the top view; a capacitor comprising a first electrode and a second electrode spaced apart from the first electrode, wherein the first electrode has at least one first metal line extending substantially along the first direction and overlapping the first and second SRAM cells, and the third SRAM cell non-overlaps the at least one first metal line in the top view; and a write driver transistor coupled between the first bit line and the first electrode of the capacitor, wherein the second electrode of the capacitor is coupled to a negative voltage level.

According to some embodiments of the present disclosure, a method for fabricating an integrated circuit device is provided. The method includes forming a static random access memory (SRAM) cell and a write driver transistor over a semiconductor substrate; forming a frontside interconnect structure over the SRAM cell and the write driver transistor, wherein the frontside interconnect structure comprises a bit line coupled to the SRAM cell, wherein the bit line extends substantially along a first direction, wherein the bit line is electrically coupled between the SRAM cell and the write driver transistor; and forming a backside interconnect structure on a backside of the write driver transistor, wherein one of the frontside interconnect structure and the backside interconnect structure comprises a first metal line electrically coupled to the write driver transistor and a second metal line adjacent to the first metal line, the first and second metal lines extend substantially along the first direction, and a length of the first metal line is less than a length of the bit line in a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:

a plurality of static random access memory (SRAM) cells;

a first bit line coupled with a column of the SRAM cells, wherein the first bit line extends substantially along a first direction;

a capacitor comprising a first electrode and a second electrode spaced apart from the first electrode, wherein the first electrode has at least one first metal line extending substantially along the first direction, and a length of the at least one first metal line is less than a length of the first bit line in a top view;

a write driver transistor coupled between the first bit line and the first electrode of the capacitor; and a negative voltage generator circuit coupled to the second electrode of the capacitor.

2. The integrated circuit device of claim 1, wherein the at least one first metal line of the first electrode overlaps the SRAM cell in the top view.

3. The integrated circuit device of claim 2, wherein a number of the SRAM cells overlapping the at least one first metal line of the first electrode is less than a number of the SRAM cells overlapping the first bit line.

4. The integrated circuit device of claim 1, wherein the second electrode has at least one second metal line extending substantially along the first direction, and a length of the at least one second metal line is less than the length of the first bit line in the top view.

5. The integrated circuit device of claim 4, further comprising:

a second bit line coupled with the column of the SRAM cell, wherein a distance between the first metal line and the second metal line is less than a distance between the first and second bit lines in the top view.

6. The integrated circuit device of claim 1, wherein the first metal line and the first bit line are of a same metallization layer.

7. The integrated circuit device of claim 1, wherein the first metal line and the first bit line are of different metallization layers.

8. The integrated circuit device of claim 1, wherein a plurality of the first metal lines are of a same metallization layer.

9. The integrated circuit device of claim 1, wherein at least two of a plurality of the first metal lines are of different metallization layers.

10. An integrated circuit device, comprising:

first, second, and third static random access memory (SRAM) cells arranged in a sequence substantially along a first direction in a top view;

a first bit line coupled with the first to third SRAM cells, wherein the first bit line extends substantially along the first direction and overlaps the first to third SRAM cells in the top view;

a capacitor comprising a first electrode and a second electrode spaced apart from the first electrode, wherein the first electrode has at least one first metal line extending substantially along the first direction and overlapping the first and second SRAM cells, and the third SRAM cell non-overlaps with the at least one first metal line in the top view; and a write driver transistor coupled between the first bit line and the first electrode of the capacitor, wherein the second electrode of the capacitor is coupled to a negative voltage level.

11. The integrated circuit device of claim 10, wherein the first bit line extends beyond an end of the at least one first metal line in the top view.

12. The integrated circuit device of claim 10, wherein an end of the at least one first metal line overlaps the second SRAM cells.

13. The integrated circuit device of claim 10, wherein the second electrode has at least one second metal line extending substantially along the first direction and overlapping the first and second SRAM cells, and the third SRAM cell is free from overlapping the at least one second metal line in the top view.

14. The integrated circuit device of claim 13, wherein a plurality of the second metal lines are interlaced with a plurality of the first metal lines in the top view.

15. The integrated circuit device of claim 10, further comprising:

a second bit line coupled with the first to third SRAM cells, wherein the second bit line extends substantially along the first direction and overlaps the first to third SRAM cells in the top view.

16. A method for fabricating an integrated circuit device, comprising:

forming a static random access memory (SRAM) cell and a write driver transistor over a semiconductor substrate;

forming a frontside interconnect structure over the SRAM cell and the write driver transistor, wherein the frontside interconnect structure comprises a bit line coupled to the SRAM cell, wherein the bit line extends substantially along a first direction, wherein the bit line is electrically coupled between the SRAM cell and the write driver transistor; and forming a backside interconnect structure on a backside of the write driver transistor, wherein one of the frontside interconnect structure and the backside interconnect structure comprises a first metal line electrically coupled to the write driver transistor and a second metal line adjacent to the first metal line, the first and second metal lines extend substantially along the first direction, and a length of the first metal line is less than a length of the bit line in a top view.

17. The method of claim 16, wherein a ratio of the length of the first metal line to the length of the bit line is in a range from about 0.1 to about 0.9.

18. The method of claim 16, wherein the first metal line and the second metal line are of a same metallization layer of the frontside interconnect structure and the backside interconnect structure.

19. The method of claim 16, wherein the first metal line and the second metal line are of different metallization layers of the frontside interconnect structure and the backside interconnect structure.

20. The method of claim 16, wherein the length of the first metal line is substantially equal to a length of the second metal line.

* * * * *